United States Patent
Takeuchi et al.

(10) Patent No.: US 7,719,201 B2
(45) Date of Patent: May 18, 2010

(54) MICRODEVICE, MICRODEVICE ARRAY, AMPLIFYING CIRCUIT, MEMORY DEVICE, ANALOG SWITCH, AND CURRENT CONTROL UNIT

(75) Inventors: Yukihisa Takeuchi, Nishikamo-Gun (JP); Tsutomu Nanataki, Toyoake (JP); Iwao Ohwada, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 1632 days.

(21) Appl. No.: 10/951,832

(22) Filed: Sep. 28, 2004

(65) Prior Publication Data

US 2005/0073790 A1  Apr. 7, 2005

Related U.S. Application Data

(63) Continuation-in-part of application No. 10/730,754, filed on Dec. 8, 2003, now Pat. No. 7,176,609, which is a continuation-in-part of application No. 10/678,958, filed on Oct. 30, 2003, now abandoned.

(30) Foreign Application Priority Data

Aug. 27, 2004  (JP) .............................. 2004-248101

(51) Int. Cl.
*G09G 3/10*  (2006.01)
*H01J 1/00*  (2006.01)
(52) U.S. Cl. ...................... 315/169.1; 313/309; 313/495
(58) Field of Classification Search ... 315/169.1–169.4; 313/395, 495, 506, 309–311, 494; 345/206, 345/212, 211
See application file for complete search history.

(56) References Cited

U.S. PATENT DOCUMENTS

| | | | |
|---|---|---|---|
| 5,280,221 A | 1/1994 | Okamoto et al. | |
| 5,453,661 A | 9/1995 | Auciello et al. | |
| 5,469,015 A | 11/1995 | Kaneko et al. | |
| 5,475,280 A * | 12/1995 | Jones et al. | 313/309 |
| 5,508,590 A | 4/1996 | Sampayan et al. | |
| 5,631,664 A | 5/1997 | Adachi et al. | |

(Continued)

FOREIGN PATENT DOCUMENTS

DE  3833604  4/1990

(Continued)

OTHER PUBLICATIONS

U.S. Appl. No. 10/730,754, filed Dec. 8, 2003, Takeuchi et al.

(Continued)

*Primary Examiner*—Douglas W Owens
*Assistant Examiner*—Jimmy T Vu
(74) *Attorney, Agent, or Firm*—Burr & Brown

(57) ABSTRACT

A microdevice has an electron emitter including a memory for accumulating electric charges corresponding to an input voltage, for emitting electrons corresponding to the electric charges accumulated in said memory; and an amplifier connected to a power supply and including a collector electrode for capturing the electrons emitted from the electron emitter. The atmosphere between at least the electron emitter and the collector electrode is a vacuum. When the electrons emitted from the electron emitter are captured by the collector electrode of the amplifier, a collector current flows between the collector electrode and the electron emitter to amplify the input voltage.

15 Claims, 33 Drawing Sheets

U.S. PATENT DOCUMENTS

| | | | |
|---|---|---|---|
| 5,666,019 A | 9/1997 | Potter | |
| 5,726,524 A | 3/1998 | Debe | |
| 5,729,094 A | 3/1998 | Geis et al. | |
| 5,747,926 A | 5/1998 | Nakamoto et al. | |
| 5,831,392 A * | 11/1998 | Hansen et al. | 315/169.1 |
| 5,874,802 A | 2/1999 | Choi et al. | |
| 5,877,594 A | 3/1999 | Miyano et al. | |
| 5,990,605 A | 11/1999 | Yoshikawa et al. | |
| 6,040,973 A | 3/2000 | Okamoto et al. | |
| 6,153,978 A | 11/2000 | Okamoto | |
| 6,157,145 A | 12/2000 | Vollkommer et al. | |
| 6,184,612 B1 | 2/2001 | Negishi et al. | |
| 6,198,225 B1 | 3/2001 | Kano et al. | |
| 6,274,881 B1 | 8/2001 | Akiyama et al. | |
| 6,285,123 B1 | 9/2001 | Yamada et al. | |
| 6,313,815 B1 | 11/2001 | Takeda et al. | |
| 6,359,383 B1 | 3/2002 | Chuang et al. | |
| 6,452,328 B1 | 9/2002 | Saito et al. | |
| 6,469,452 B2 | 10/2002 | Seo et al. | |
| 6,479,924 B1 | 11/2002 | Yoo | |
| 6,580,108 B1 | 6/2003 | Utsumi et al. | |
| 7,176,876 B2 * | 2/2007 | Kabuto et al. | 345/100 |
| 2002/0047588 A1 * | 4/2002 | Xia | 315/169.4 |
| 2002/0060516 A1 | 5/2002 | Kawate et al. | |
| 2002/0153827 A1 | 10/2002 | Takeuchi et al. | |
| 2004/0061431 A1 | 4/2004 | Takeuchi et al. | |
| 2004/0066133 A1 | 4/2004 | Takeuchi et al. | |
| 2004/0090398 A1 | 5/2004 | Takeuchi et al. | |
| 2004/0100200 A1 | 5/2004 | Takeuchi et al. | |
| 2004/0104684 A1 | 6/2004 | Takeuchi et al. | |
| 2004/0104689 A1 | 6/2004 | Takeuchi et al. | |
| 2004/0104690 A1 | 6/2004 | Takeuchi et al. | |
| 2004/0113561 A1 | 6/2004 | Takeuchi et al. | |

FOREIGN PATENT DOCUMENTS

| | | |
|---|---|---|
| DE | 10057072 | 5/2001 |
| EP | 0 353 632 | 2/1990 |
| EP | 428853 | 5/1991 |
| EP | 0 953 958 A2 | 11/1999 |
| EP | 1 424 716 | 6/2004 |
| FR | 2639151 | 5/1990 |
| FR | 2675306 | 10/1992 |
| FR | 2789221 | 8/2000 |
| FR | 2789223 | 8/2000 |
| JP | 44-26125 | 11/1969 |
| JP | 46-20944 | 6/1971 |
| JP | 59-208587 | 11/1984 |
| JP | 63-150837 A | 6/1988 |
| JP | 1-311533 A | 12/1989 |
| JP | 5-2985 | 1/1993 |
| JP | 05-325777 A1 | 12/1993 |
| JP | 6-103886 | 4/1994 |
| JP | 07-094104 | 4/1995 |
| JP | 7-147131 A | 6/1995 |
| JP | 08-020126 A1 | 1/1996 |
| JP | 08-111166 A1 | 4/1996 |
| JP | 08-203418 A1 | 8/1996 |
| JP | 09-090882 A | 4/1997 |
| JP | 10-27539 A | 1/1998 |
| JP | 11-185600 | 7/1999 |
| JP | 11-288249 A | 10/1999 |
| JP | 2000-251618 A1 | 9/2000 |
| JP | 2000-285801 A | 10/2000 |
| JP | 2000-310970 A | 11/2000 |
| JP | 2001-015011 A1 | 1/2001 |
| JP | 3160213 B2 | 2/2001 |
| JP | 3214256 B2 | 7/2001 |
| JP | 2001-312956 A1 | 11/2001 |
| JP | 2003-123624 A1 | 4/2003 |
| JP | 2004-228063 | 8/2004 |
| WO | 02/052600 A1 | 7/2002 |

OTHER PUBLICATIONS

U.S. Appl. No. 10/951,509, filed Sep. 28, 2004, Takeuchi et al.
U.S. Appl. No. 10/950,976, filed Sep. 27, 2004, Takeuchi et al.
U.S. Appl. No. 10/952,524, filed Sep. 28, 2004, Takeuchi et al.
U.S. Appl. No. 10/459,415, filed Jun. 11, 2003, Takeuchi et al.
U.S. Appl. No. 10/647,794, filed Aug. 25, 2003, Takeuchi et al.
U.S. Appl. No. 10/719,521, filed Nov. 21, 2003, Takeuchi et al.
U.S. Appl. No. 10/731,901, filed Dec. 9, 2003, Takeuchi et al.
U.S. Appl. No. 10/808,258, filed Mar. 24, 2004, Takeuchi et al.
U.S. Appl. No. 10/901,932, filed Jul. 29, 2004, Takeuchi et al.
U.S. Appl. No. 10/919,678, filed Aug. 17 2004, Takeuchi et al.
U.S. Appl. No. 10/979,747, filed Aug. 17 2004, Takeuchi et al.
"Pulsed Electron Source Using a Ferroelectric Cathode," Tokyo Institute of Technology, vol. 68, No. 5, Jan. 7, 1999, pp. 546-550.
Puchkarev, Victor F. and Mesyats, Gennady A., "On the Mechanism of Emission from the Ferroelectric Ceramic Cathode," Journal of Applied Physics, vol. 78, No. 9, Nov. 1, 1995, pp. 5633-5637.
Riege, H., "Electron Emission from Ferroelectrics—a Review," Nucl. Instr. and Meth. A340, 1994, pp. 80-89.
Masatoshi Miyake et al., "Electron Emission from Ferroelectric Cathodes Excited by Pulsed Voltage," Tokyo Institute of Technology, vol. 119, No. 5, 1999 pp. 622-627.
G. Benedek et al., "Electron Emission From Ferroelectric/Antiferroelectric Cathodes Excited by Short High-Voltage Pulses," Journal Applied Physics, vol. 81, No. 3, Feb. 1, 1997, pp. 1396-1403.
Gundel, H. et al., "Low Pressure Hollow Cathode Switch Triggered by a Pulsed Electron Beam Emitted From Ferroelectrics," Applied Physics Letter, American Institute of Physics, New York, US vol. 54, No. 21, May 22, 1989, pp. 2071-2073.
Gundel, H. et al., "Time-Dependent Electron Emission From Ferroelectrics by External Pulsed Electric Fields," Journal of Applied Physics, American Institute of Physics, New York, US vol. 69, No. 2, Jan. 15, 1991, pp. 975-982.
Kanemaru, Seigou, "Featuring: All About Flat Displays 2000, Leading Technological Trend of FEDs," Electronic Engineering, Nikkan Kogyo Shimbun, Ltd., Jul. 2000, pp. 38-41 (with partial translation).

* cited by examiner

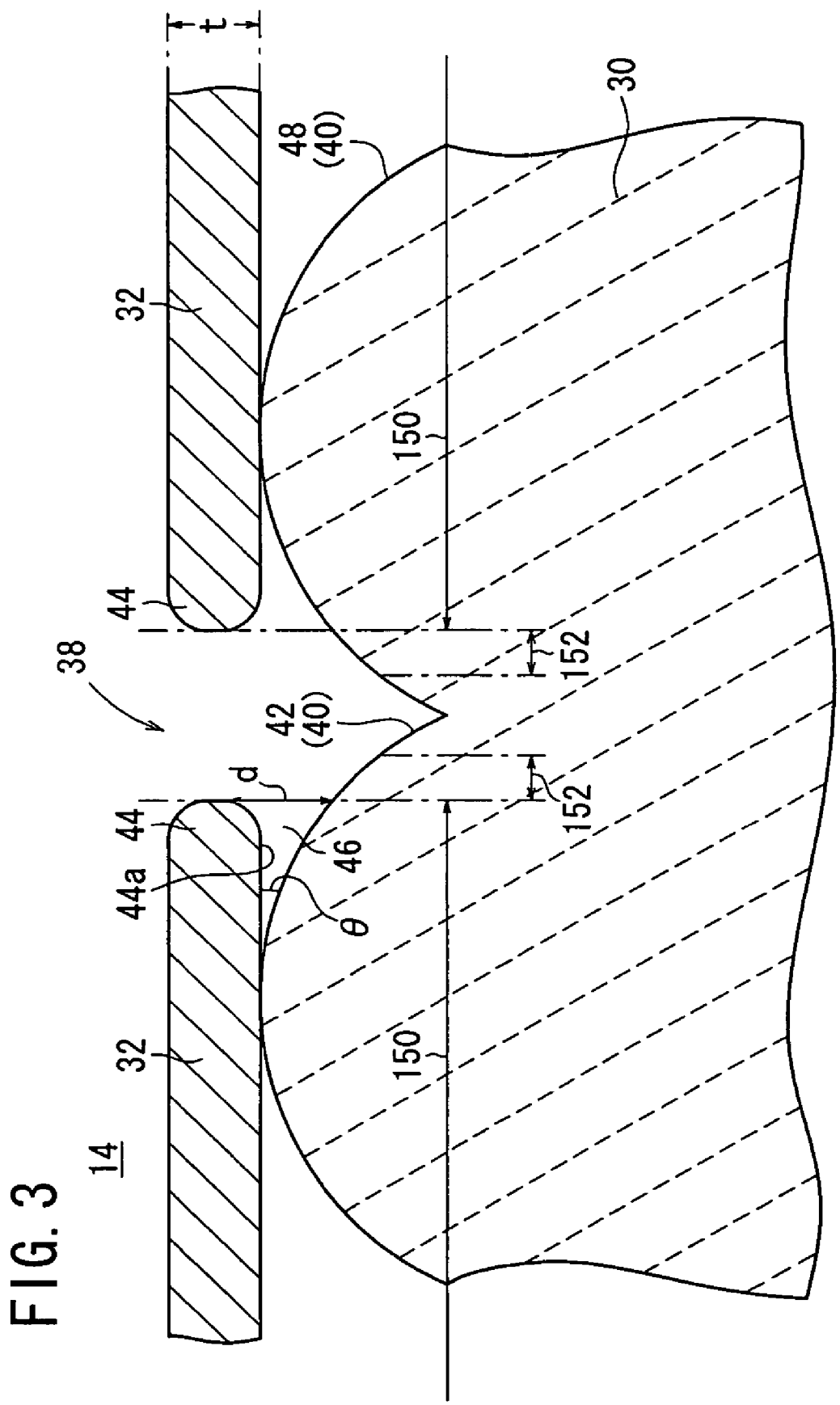

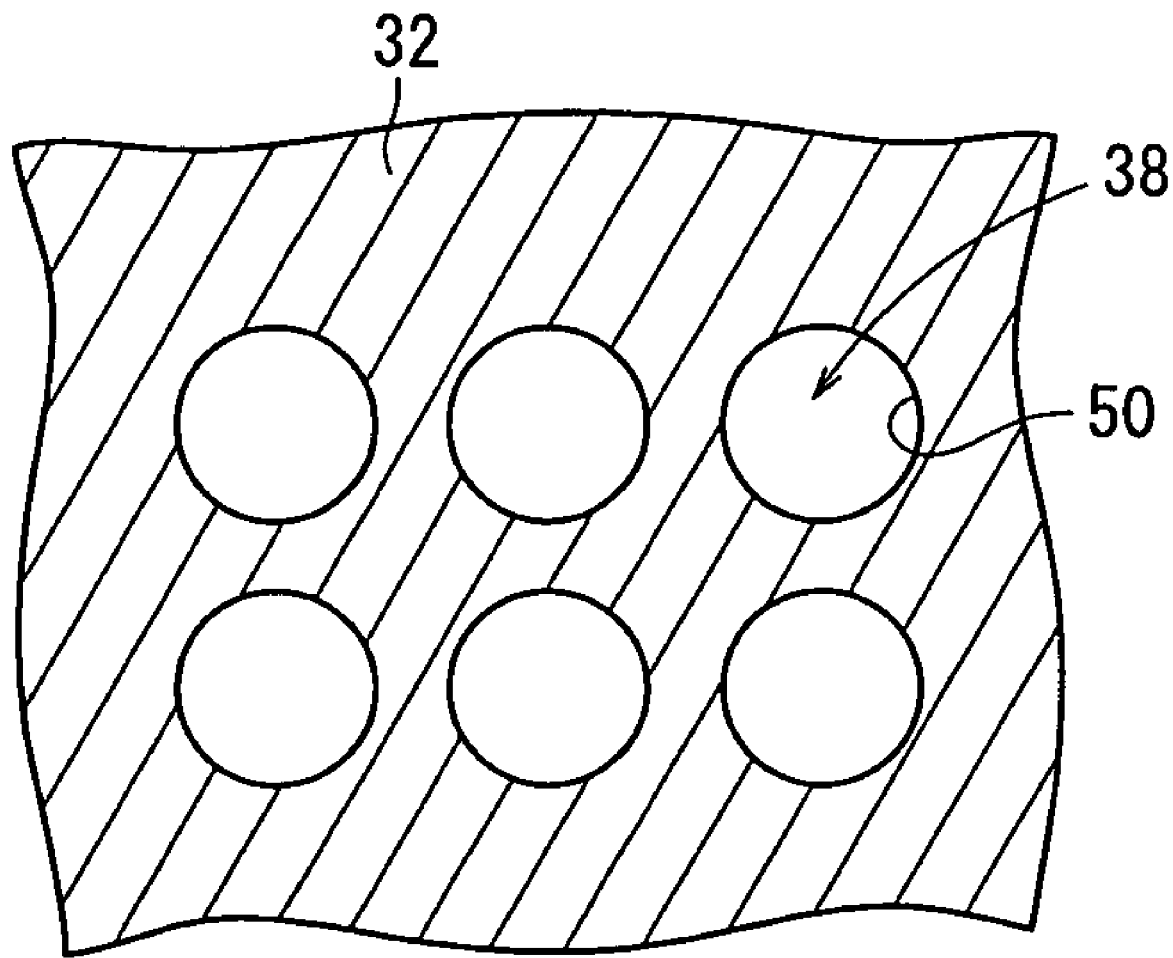

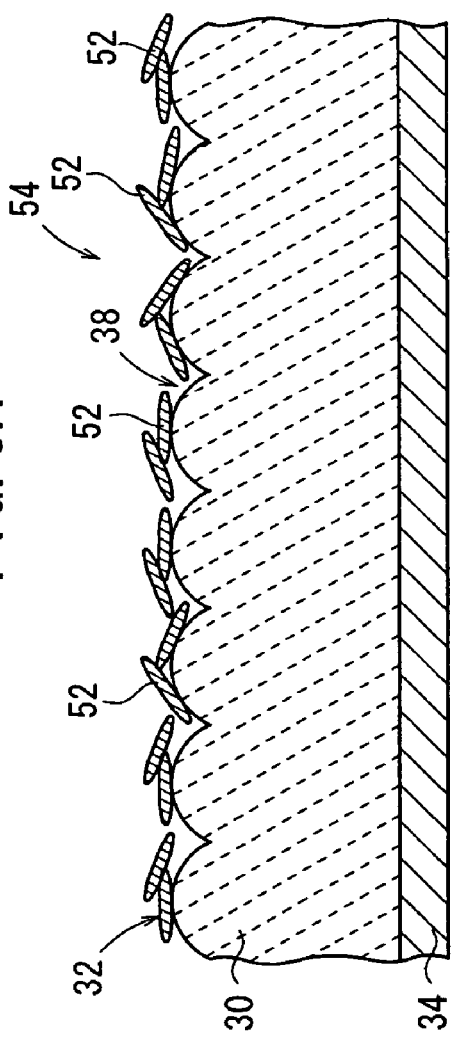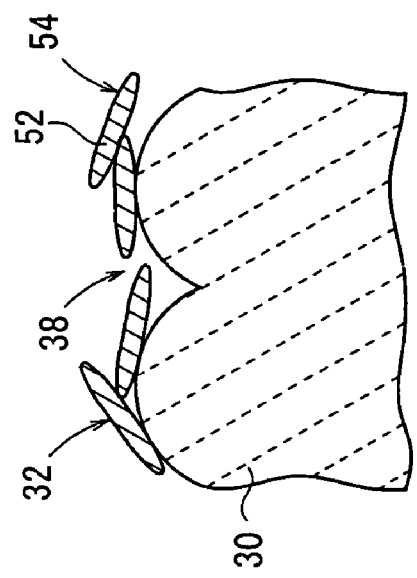

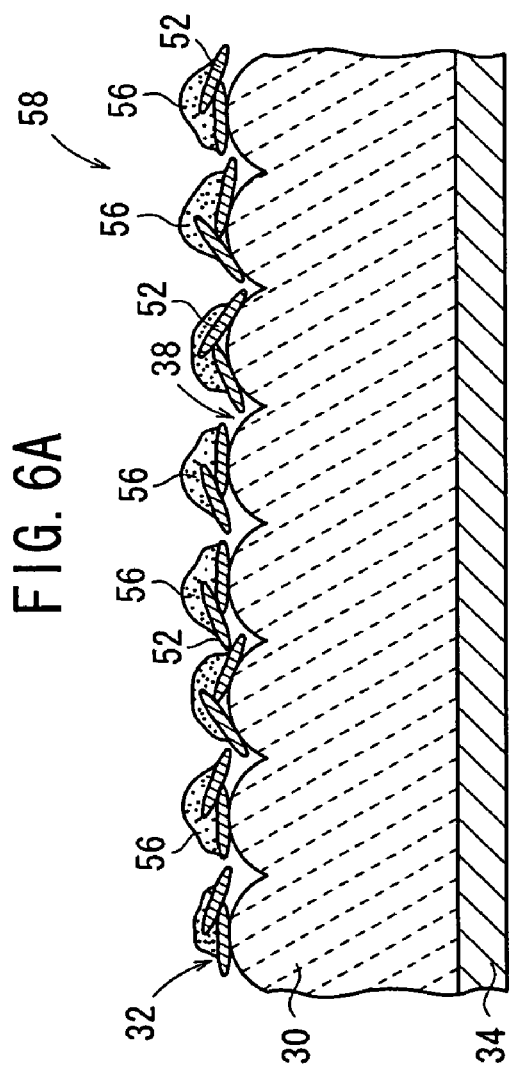

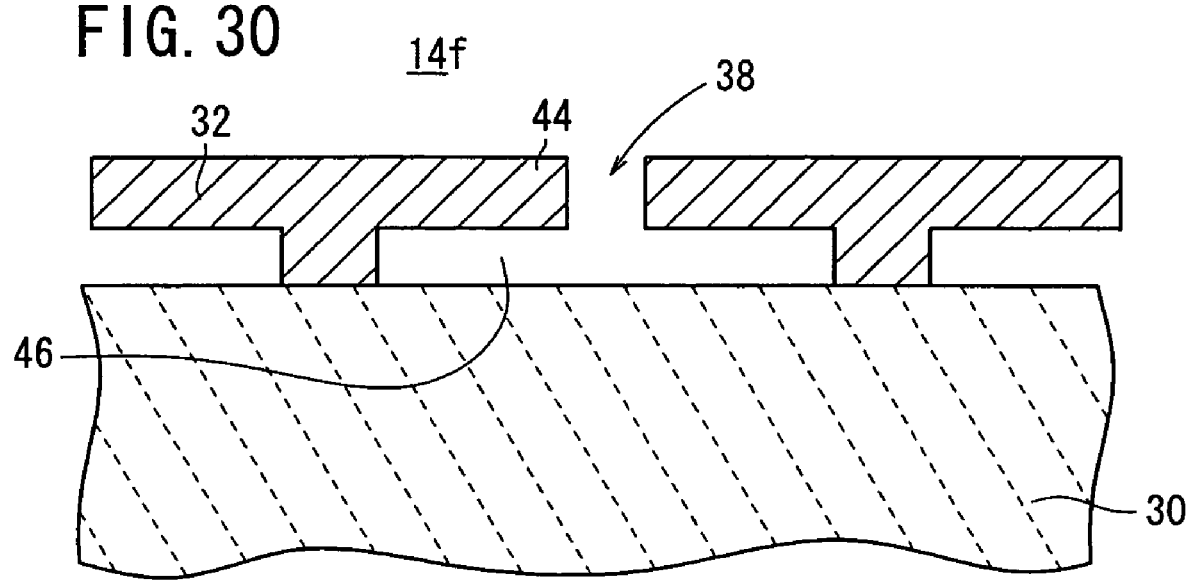

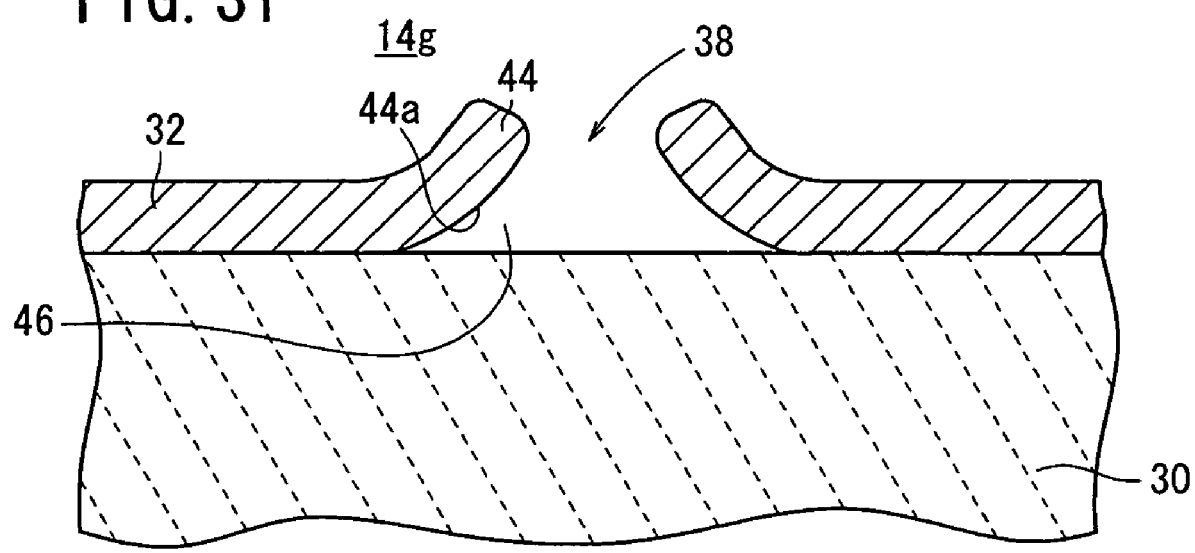

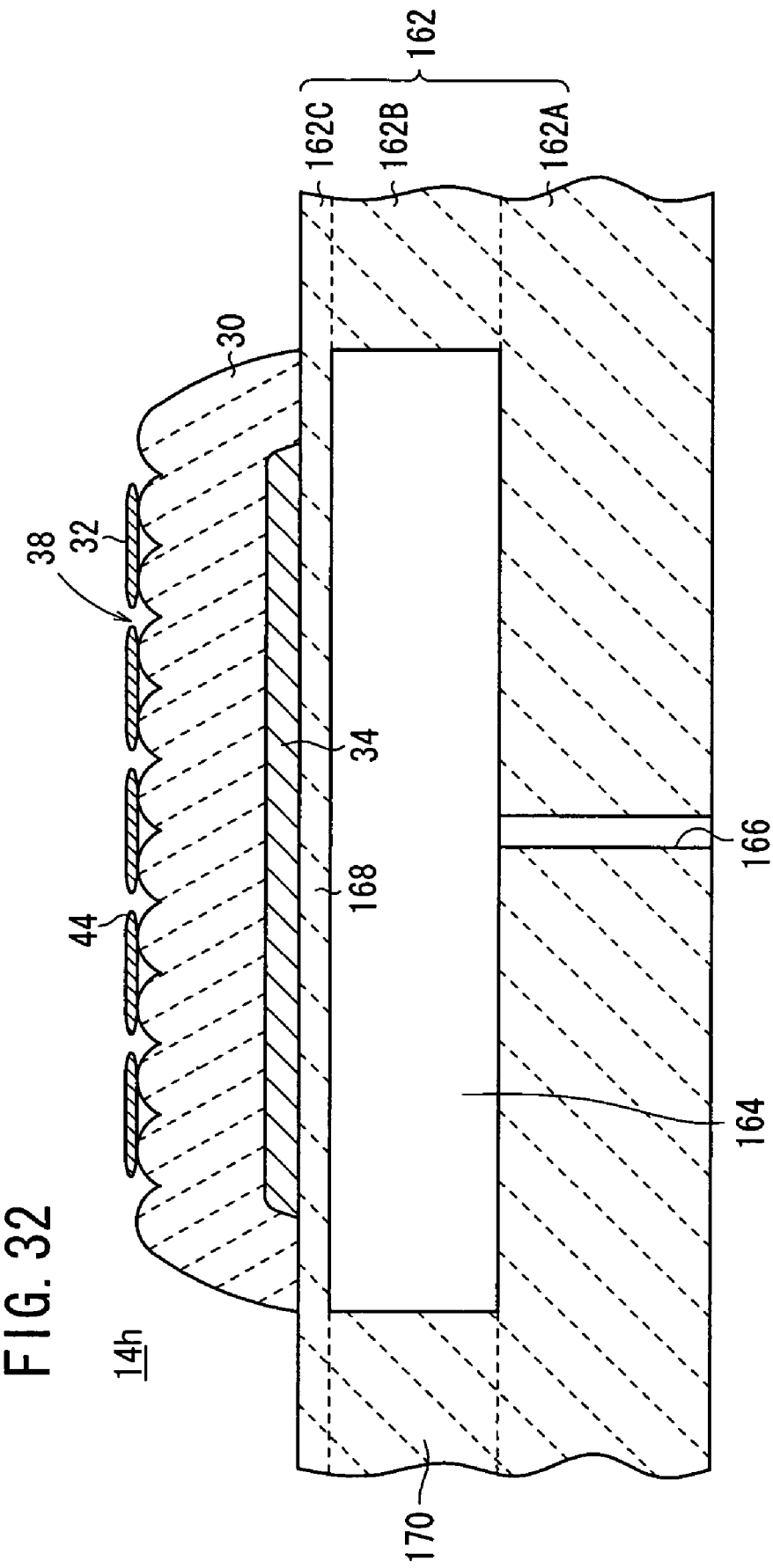

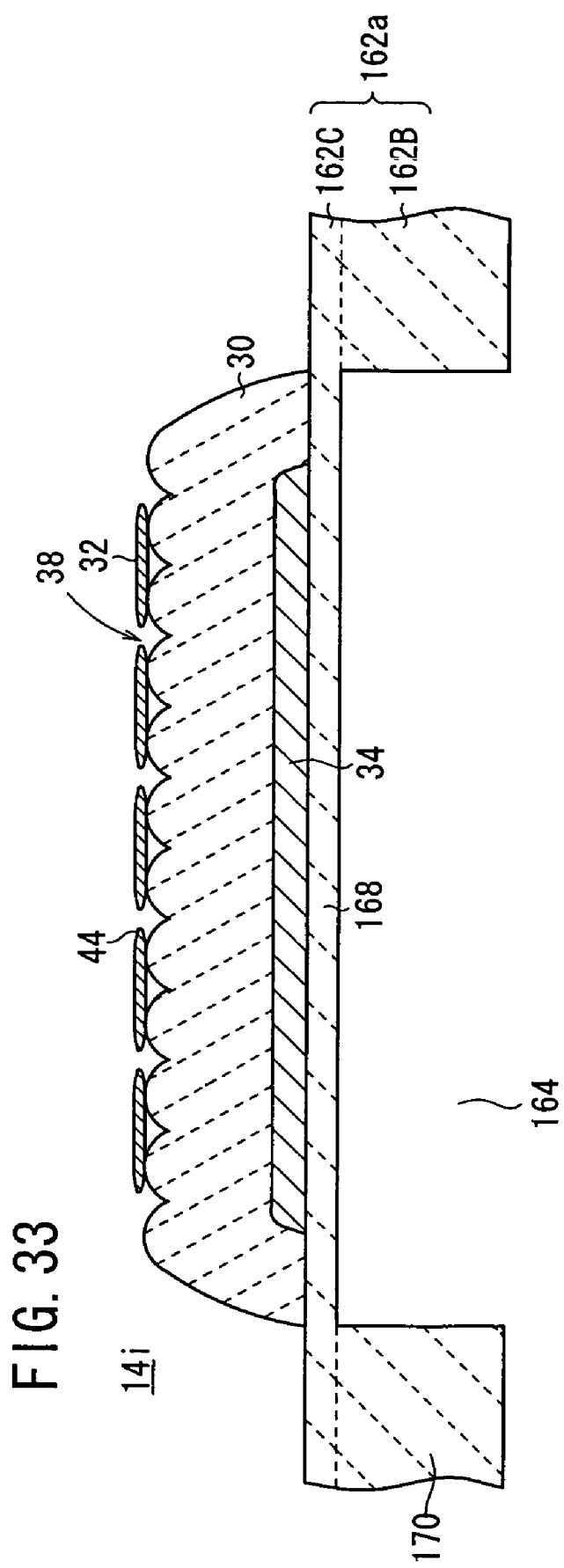

MICRODEVICE, MICRODEVICE ARRAY, AMPLIFYING CIRCUIT, MEMORY DEVICE, ANALOG SWITCH, AND CURRENT CONTROL UNIT

CROSS REFERENCE TO RELATED APPLICATIONS

This application is a continuation-in-part of U.S. application Ser. No. 10/730,754, filed Dec. 8, 2003, which is a continuation-in-part of U.S. application Ser. No. 10/678,958, filed Oct. 3, 2003, the entireties of which are incorporated herein by reference.

This application also claims the benefit of Japanese Application 2004-248,101, filed Aug. 27, 2004, the entirety of which is incorporated herein by reference.

BACKGROUND OF THE INVENTION

1. Field of the Invention

The present invention relates to a microdevice, a microdevice array, an amplifying circuit, a memory device, an analog switch, and a current control unit which incorporate an electron emitter having a first electrode and a second electrode that are disposed on an emitter.

2. Description of the Related Art

Recently, electron emitters each having a cathode electrode and an anode electrode have been finding use in various applications such as field emission displays (FEDs) and backlight units. In an FED, a plurality of electron emitters are arranged in a two-dimensional array, and a plurality of phosphors are positioned in association with the respective electron emitters with a predetermined gap left therebetween.

Conventional electron emitters are disclosed in Japanese laid-open patent publication No. 1-311533, Japanese laid-open patent publication No. 7-147131, Japanese laid-open patent publication No. 2000-285801, Japanese patent publication No. 46-20944, and Japanese patent publication No. 44-26125, for example. All of these disclosed electron emitters are disadvantageous in that since no dielectric material is employed in the emitter section, a forming process or a micro-machining process is required between facing electrodes, a high voltage needs to be applied between the electrodes to emit electrons, and a panel fabrication process is complex and entails a high production cost.

It has been considered to make an emitter section of a dielectric material. Various theories about the emission of electrons from a dielectric material have been presented in the documents: Yasuoka and Ishii, "Pulsed Electron Source Using a Ferroelectric Cathode", OYO BUTURI (A monthly publication of The Japan Society of Applied Physics), Vol. 68, No. 5, pp. 546-550 (1999), V. F. Puchkarev, G. A. Mesyats, "On the Mechanism of Emission from the Ferroelectric Ceramic Cathode", J. Appl. Phys., Vol. 78, No. 9, 1 Nov. 1995, pp. 5633-5637, and H. Riege, "Electron Emission from Ferroelectrics—A Review", Nucl. Instr. and Meth. A340, pp. 80-89 (1994).

Known applications of electron emitters include light sources and display apparatus for emitting phosphor light by causing emitted electrons to impinge upon phosphors. In other words, it is usual that the electrons emitted from the electron emitter are used as an electron beam.

SUMMARY OF THE INVENTION

It is an object of the present invention to provide a microdevice and a microdevice array which make it possible to incorporate an electron emitter in an electronic circuit other than light sources and display apparatus, such as an amplifying circuit having a memory function, a memory device, an analog switch, or the like, and which have an output dynamic range that is about 1000 times as large as an input dynamic range thereof and is capable of responding to an input signal at a high speed.

Another object of the present invention is to provide an amplifying circuit having a memory function which incorporates an electron emitter to amplify and output an input voltage in an output dynamic range that is about 1000 times as large as a dynamic range of the input voltage, and to respond to an input signal at a high speed.

Still another object of the present invention is to provide a memory device which incorporates an electron emitter to amplify and output an input write voltage in an output dynamic range that is about 1000 times as large as a dynamic range of the write voltage, and to read the write voltage at a high speed.

Yet another object of the present invention is to provide an analog switch which incorporates an electron emitter to provide an insulation capability for a high withstand voltage in the order of 10 kV when turned off, and output an analog output voltage corresponding to an analog input voltage at a high speed when turned on.

Yet still another object of the present invention is to provide a current control unit incorporating an electron emitter to have a high withstand voltage.

A microdevice according to the present invention has an electron emitter including a memory for accumulating electric charges corresponding to an input voltage, for emitting electrons corresponding to the electric charges accumulated in the memory; and an amplifier connected to a power supply and including a collector electrode for capturing the electrons emitted from the electron emitter, in which the atmosphere between at least the electron emitter and the collector electrode is a vacuum.

According to the above arrangement, in operation, electric charges corresponding to an input voltage are accumulated in the memory of the electron emitter, and electrons corresponding to the accumulated electric charges are emitted from the electron emitter. The electrons emitted from the electron emitter are captured by the collector electrode of the amplifier. At this time, a current (collector current) flows between the collector electrode and the electron emitter, amplifying the input voltage.

In other words, an equivalent circuit representation of the operation of the microdevice during the emission of electrons from the electron emitter comprises a field effect transistor having a drain provided by the collector electrode and a gate by the memory. When a voltage corresponding to the electric charges accumulated in the memory is applied to the gate of the transistor, a drain current (collector current) flows between the drain and the source of the transistor through the collector electrode. With a load connected to the collector electrode, a voltage drop is developed across the load and extracted as an output voltage (amplified voltage).

Since the transistor comprises the electron emitter, unlike a transistor in the form of a semiconductor, a power supply having a power supply voltage which is about 1000 times (e.g., about 10 kV) as high as a logic level voltage can be connected to the collector electrode. Therefore, an output dynamic range of the microdevice can be 1000 times as large as an input dynamic range thereof. This leads to a reduction in the input voltage such that a voltage level used in logic circuits (ranging from 0 to 10 V) can be used as a level of the input voltage. Consequently, a drive circuit for supplying the input voltage to the electron emitter may be operated under a lower voltage for lower power consumption.

In the microdevice, the atmosphere between at least the electron emitter and the collector electrode is a vacuum. In a transistor in the form of a semiconductor, electrons move in a semiconductor crystal. According to the present invention, since electrons move in the vacuum, they can move faster than in the semiconductor. Since the collector current flows faster than in the semiconductor, the microdevice can respond to an input signal at a high speed.

The electron emitter of the microdevice according to the present invention can be incorporated in an electronic circuit other than light sources and display apparatus, such as an amplifying circuit having a memory function, a memory device, an analog switch, or the like. The microdevice has an output dynamic range that is about 1000 times as large as an input dynamic range thereof and is capable of responding to an input signal at a high speed.

Further, because the atmosphere between at least the electron emitter and the collector electrode is a vacuum, the microdevice according to the present invention is useful as an environmentally-resistant device and can operate in a wide range of temperatures and humidity. For example, the microdevice can operate in a temperature range from −55° to 110° C.

A vacuum level in the atmosphere between the electron emitter and the collector electrode may preferably range from $10^{-3}$ to $10^{-5}$ Pa. The vacuum in the atmosphere between the electron emitter and the collector electrode allows the electrons emitted from the electron emitter to move at a high speed to the collector electrode, and thus makes it unnecessary to increase the size of a support for the structural members of the electron emitter and a sealing section of the vacuum, allowing the electron emitter to be reduced in size.

In the above arrangement, the input voltage may be applied to the electron emitter in a first period to accumulate electric charges corresponding to a level of the input voltage in the electron emitter, and a voltage necessary to emit electrons may be applied to the electron emitter in a second period to emit a number of electrons corresponding to the accumulated electric charges from the electron emitter. Further, the amplifier may output a voltage corresponding to a collector current that flows in the collector electrode when the electrons are emitted from the electron emitter.

A load may be connected between the collector electrode and the power supply, and the microdevice may output a voltage generated across the load by the collector current.

The electron emitter may have an emitter made of dielectric material and a first electrode and a second electrode between which a voltage is applicable. The first electrode may be disposed on a first surface of the emitter, and the second electrode may be disposed on a second surface of the emitter. At least the first electrode may have a plurality of through regions through which the emitter is exposed. Each of the through regions of the first electrode may include a peripheral portion having a surface facing the emitter, and the surface may be spaced from the emitter.

In the above arrangement, a voltage is firstly applied between the first electrode and the second electrode. The voltage is defined as a voltage, such as a pulse voltage or an alternating voltage, which abruptly changes with time from a voltage level that is higher or lower than a reference voltage (e.g., 0 V) to a voltage level that is lower or higher than the reference voltage. Alternatively, a voltage having a voltage level that is higher or lower than the reference voltage and a voltage having a voltage level that is lower or higher than the reference voltage may be supplied from respective different systems.

A triple junction is formed in a region of contact between the first surface of the emitter, the first electrode, and a medium (e.g., a vacuum) around the electron emitter. The triple junction is defined as an electric field concentration region formed by contact between the first electrode, the emitter, and the vacuum. The triple junction includes a triple point where the first electrode, the emitter, and the vacuum exist as one point. According to the present invention, the triple junction is formed on peripheral portions of the through regions and a peripheral area of the first electrode. Therefore, when the voltage is applied between the first electrode and the second electrode, an electric field concentration occurs at the triple junction.

In a first stage, a voltage lower or higher than the reference voltage, i.e., the input voltage, is applied between the first electrode and the second electrode, and an electric field concentration occurs at the triple junction referred to above and/or the tip end of the first electrode, causing the first electrode to emit electrons toward the emitter. The emitted electrons are accumulated in portions of the emitter which are exposed through the through region of the first electrode and regions near the outer peripheral portion of the first electrode. At this time, portions of the emitter where the electrons are accumulated and function as a memory, and the first electrode functions as an electron supply source.

In a second stage, a drive voltage quickly changes in voltage level, and a voltage that is lower or higher than the reference voltage is applied between the first electrode and the second electrode. The electrons accumulated in the portions of the first electrode which correspond to the through regions and the regions near the outer peripheral portion of the first electrode are now expelled from the emitter by dipoles (whose negative poles appear on a surface of the emitter) in the emitter whose polarization has been inverted in the opposite direction. The electrons are emitted from the portions of the emitter where the electrons have been accumulated, through the through regions. The electrons are also emitted from the regions near the outer peripheral portion of the first electrode. At this time, electrons corresponding to the amount of electric charges in the emitter in the first stage are emitted from the emitter in the second stage. The amount of the electric charges in the emitter in the first stage is maintained until the electrons are emitted in the second stage. That is, analog data corresponding to the amount of electric charges is stored.

Since the first electrode of the electron emitter has plural through regions, electrons are uniformly emitted from each of the through regions and the outer peripheral portions of the first electrode. Thus, any variations in the overall electron emission characteristics of the electron emitter are reduced, making it possible to facilitate the control of the electron emission and increase electron emission efficiency.

Because a gap is formed between the emitter and a surface of the peripheral portion of the through region which faces the emitter, when the voltage is applied, an electric field concentration tends to be produced in the region of the gap. This leads to a higher efficiency of the electron emission, making the voltage lower (emitting electrons at a lower voltage level).

As described above, in the electron emitter used in the microdevice according to the present invention, since the gap is formed between the emitter and the surface of the peripheral portion of the through region which faces the emitter, the peripheral portion of the through region of the first electrode is formed as an overhanging portion (flange). Together with the increased electric field concentration in the region of the gap, electrons are easily emitted from the overhanging portion (the peripheral portion of the through region). This leads to a higher output and higher efficiency of the electron emission, making the drive voltage lower. Since the peripheral portion of the through region of the first electrode functions as a gate electrode (a control electrode, a focusing electronic lens, or the like), straightness of emitted electrons can be improved. This is effective in reducing crosstalk between memory devices especially if a number of electron emitters are arrayed for use as a memory array, for example, and also effective in reducing crosstalk between analog switches if a number of electron emitters are arrayed for use as an analog multiplexer, for example.

The electron emitter may have an emitter made of dielectric material, a first electrode disposed in contact with a first surface of the emitter, and a second electrode disposed in contact with a second surface of the emitter, and at least the first electrode may have a plurality of through regions through which the emitter is exposed. The electron emitter may also have in its electrical operation, between the first electrode and the second electrode, a capacitor formed from the emitter, and a cluster of capacitors provided between the first electrode and the emitter by the through regions of the first electrode.

Specifically, gaps are formed between the emitter and the surfaces of the peripheral portions of the through regions which face the emitter, and a cluster of capacitors are formed from the gaps. The capacitance of the cluster of capacitors formed from the gaps is relatively small. Because a voltage division occurs between the cluster of capacitors and the capacitor of the emitter, almost the entire applied voltage is applied across the gaps, which effectively produces a higher output of the electron emission. The cluster of capacitors is connected in series to the capacitor of the emitter. Therefore, the overall capacitance is smaller than the capacitance of the capacitor of the emitter. This is effective in providing such preferred characteristics as the electron emission being performed for a higher output while the overall power consumption is lowered.

In the above electron emitter, at least the emitter may have an uneven surface based on the grain boundary of the dielectric material, and the through regions of the first electrode may be formed in areas corresponding to notches or concavities in the grain boundary of the dielectric material. The first electrode may comprise a cluster of a plurality of scale-like members or a cluster of electrically conductive members including scale-like members.

With the above arrangement, it is easy to keep the surfaces of the peripheral portions of the through regions which face the emitter, spaced from the emitter, i.e., to form the gaps between the emitter and the surfaces of the peripheral portions of the through regions which face the emitter.

A microdevice array according to the present invention includes a first substrate having thereon a two-dimensional array of microdevices described above, and interconnects interconnecting the microdevices and interconnects interconnecting the microdevices and input/output terminals; a second substrate having individual collector electrodes positioned in facing relation to the respective microdevices disposed on the first substrate, and interconnects interconnecting the collector electrodes and interconnects interconnecting the collector electrodes and input/output terminals; and a power supply connected to the collector electrodes and providing an amplifier, in which the atmosphere between at least the first substrate and the second substrate is a vacuum.

The microdevice array according to the present invention is easily applicable to an amplifying circuit having a memory function, a memory device, an analog switch, or the like. In addition, the microdevice array has an output dynamic range that is about 1000 times as large as an input dynamic range thereof and is capable of responding to an input signal at a high speed. As the straightness of motion of electrons emitted from each of the electron emitters can be improved, crosstalk between the microdevices is also reduced, allowing them to be highly integrated together. It is thus possible to highly integrate a high-voltage output circuit which cannot be produced with semiconductors.

An amplifying circuit according to the present invention has an electron emitter including a memory for accumulating electric charges corresponding to an input voltage and emitting electrons corresponding to the electric charges accumulated in the memory; and an amplifier connected to a power supply and including a collector electrode for capturing the electrons emitted from the electron emitter, in which the atmosphere between at least the electron emitter and the collector electrode is a vacuum.

Accordingly, the amplifying circuit can have an output dynamic range that is about 1000 times as large as an input dynamic range thereof, have a memory function, and can respond to an input signal at a high speed.

A memory device according to the present invention has an electron emitter including a memory for accumulating electric charges corresponding to a write voltage, for emitting electrons corresponding to the electric charges accumulated in the memory; and an amplifier connected to a power supply and including a collector electrode for capturing the electrons emitted from the electron emitter, in which the atmosphere between at least the electron emitter and the collector electrode is a vacuum.

In the above arrangement, the write voltage may be applied to the electron emitter in a write period to accumulate electric charges corresponding to a level of the write voltage in the electron emitter, and a read voltage necessary to emit electrons may be applied to the electron emitter in a read period to emit electrons corresponding to the accumulated electric charges from the electron emitter. Further, the amplifier may output a voltage corresponding to a collector current that flows in the collector electrode when the electrons are emitted from the electron emitter.

Accordingly, the memory device can amplify and output the write voltage at a level in an output dynamic range that is about 1000 times as large as the write voltage applied to the electron emitter. The write voltage can be read from the memory device at a high speed.

In the above memory device, the write voltage may comprise an analog voltage corresponding to analog data, and the electric charges accumulated in the memory may represent an analog value corresponding to the analog data. Accordingly, the memory device can store analog data singly, can be highly integrated, and allows the stored analog data to be read without accuracy reductions. The read voltage for reading the analog data stored in the memory may be of a constant value independent of the analog data.

Heretofore, analog data such as sensor output data is converted into digital data and stored in a memory having bits depending on desired accuracy. The stored digital data is read from the memory and converted back into analog data, which is output to a drive circuit, for example. On the other hand, the memory device according to the present invention does not need expensive A/D and D/A converters, and is free of data accuracy reductions which would be caused by A/D and D/A converting processes.

An analog switch according to the present invention has an electron emitter including a memory for accumulating electric charges corresponding to an input voltage, for emitting electrons corresponding to the electric charges accumulated in the memory; and an amplifier connected to a power supply and including a collector electrode for capturing the electrons emitted from the electron emitter, in which the atmosphere between at least the electron emitter and the collector electrode is a vacuum.

In the above arrangement, the input voltage may be applied to the electron emitter in an input period to accumulate electric charges corresponding to a level of the input voltage in the electron emitter, and an on-control voltage necessary to emit electrons may also be applied to the electron emitter in an on-control period to emit electrons corresponding to the accumulated electric charges from the electron emitter. Further, the amplifier may output a voltage corresponding to a collector current that flows in the collector electrode when the electrons are emitted from the electron emitter.

With the above arrangement, the analog switch can provide an insulation capability for a high withstand voltage in the order of 10 kV when turned off, and output an analog output voltage corresponding to the input voltage Vi at a high speed when turned on.

A current control unit according to the present invention has an electron emitter that has a memory for accumulating electric charges corresponding to an input voltage, for emitting electrons corresponding to the electric charges accumulated in the memory; and an amplifier connected to a power supply and including a collector electrode for capturing the electrons emitted from the electron emitter, in which a direction and an amount of an output current is controlled based on a direction and an amount of a collector current that flows into the collector electrode when the electrons are emitted from the electron emitter. With this arrangement, the current control unit has a high withstand voltage and is capable of controlling a current over a wide range of temperatures and humidity.

As described above, with the microdevice and the microdevice array according to the present invention, the electron emitter can be incorporated in an electronic circuit other than light sources and display apparatus, such as an amplifying circuit having a memory function, a memory device, an analog switch, or the like. The microdevice and the microdevice array can have an output dynamic range that is about 1000 times as large as an input dynamic range thereof and are capable of responding to an input signal at a high speed. Furthermore, since the atmosphere between at least the electron emitter and the collector electrode is a vacuum, the microdevice and the microdevice array are useful as an environmentally-resistant device that can operate in a wide range of temperatures and humidity. For example, the microdevice and the microdevice array can operate in a temperature range from −55° to 110° C.

The amplifying circuit according to the present invention, which incorporates the electron emitter, can amplify and output an input voltage at a level in an output dynamic range that is about 1000 times as large as a level of the input voltage in an input dynamic range thereof, have a memory function, and respond to an input signal at a high speed.

The memory device according to the present invention, which incorporates the electron emitter, can amplify and output a write voltage applied to the electron emitter, at a level in an output dynamic range that is about 1000 times as large as a level of the input voltage in an input dynamic range thereof. The write voltage can be read from the memory device at a high speed.

The analog switch according to the present invention, which incorporates the electron emitter, can provide an insulation capability for a high withstand voltage in the order of 10 kV when turned off, and output an analog output voltage corresponding to an analog input voltage at a high speed when turned on.

The current control unit according to the present invention can achieve a high withstand voltage and control a current in a wide range of temperatures and humidity.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 3 is an enlarged fragmentary cross-sectional view of the electron emitter;

FIG. 4 is a plan view showing an example of shapes of through regions defined in an upper electrode;

FIG. 5A is a cross-sectional view of another example of the upper electrode;

FIG. 5B is an enlarged fragmentary cross-sectional view of the upper electrode;

FIG. 6A is a cross-sectional view of still another example of the upper electrode;

FIG. 6B is an enlarged fragmentary cross-sectional view of the upper electrode;

FIG. 30 is a fragmentary cross-sectional view of an electron emitter according to a sixth modification;

FIG. 31 is a fragmentary cross-sectional view of an electron emitter according to a seventh modification;

FIG. 32 is a fragmentary cross-sectional view of an electron emitter according to an eighth modification; and FIG. 33 is a fragmentary cross-sectional view of an electron emitter according to a ninth modification.

DETAILED DESCRIPTION OF THE INVENTION

A microdevice, a microdevice array, an amplifying circuit, a memory device, an analog switch, and a current control unit according to embodiments of the present invention will be described below with reference to FIGS. 1 through 33.

Figure 1:
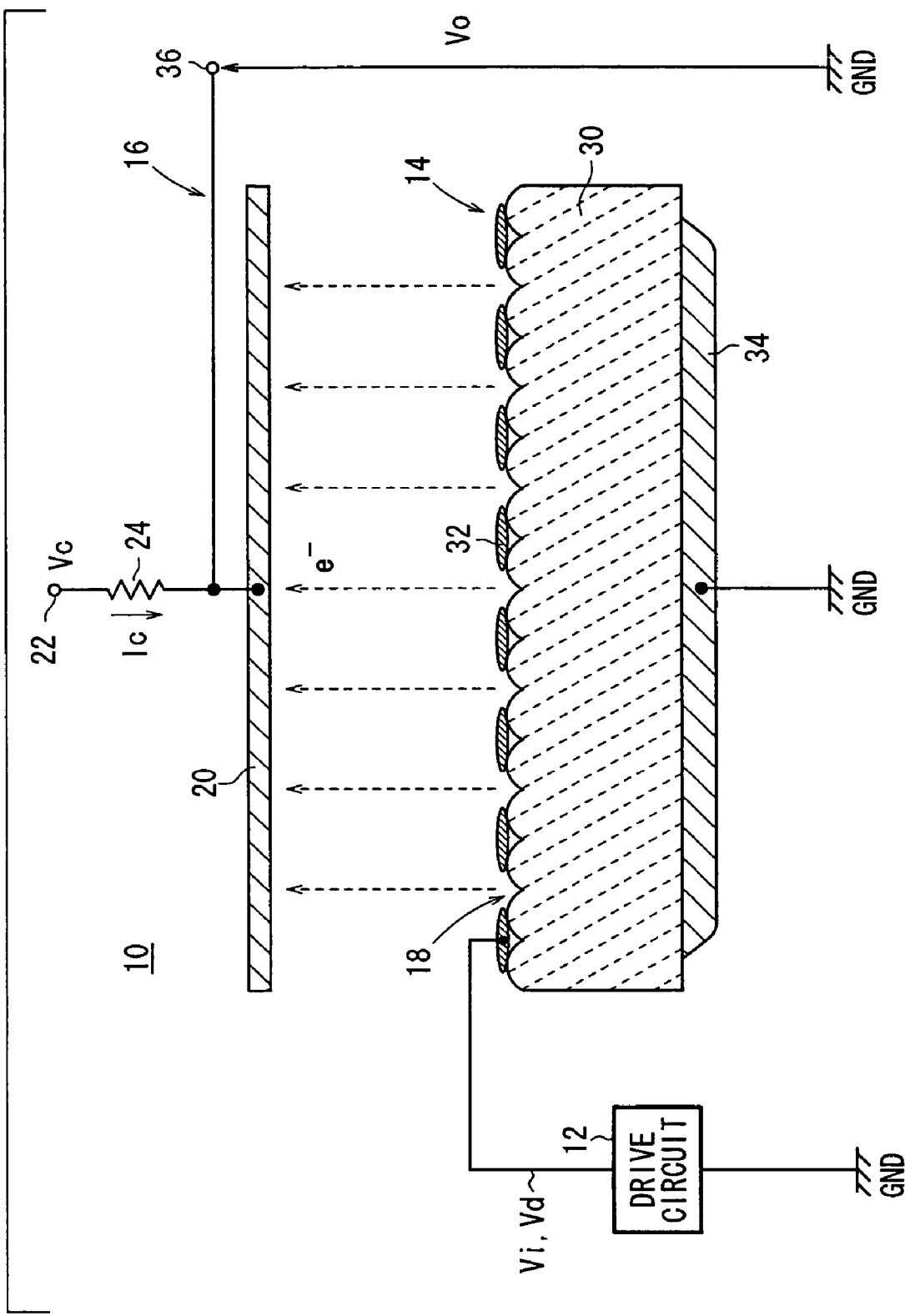
FIG. 1 is a schematic diagram of a microdevice according to an embodiment of the present invention.

As shown in FIG. 1, a microdevice 10 according to an embodiment of the present invention has a drive circuit 12, an electron emitter 14, and an amplifier 16.

The drive circuit 12 is arranged to apply an input voltage Vi and a drive voltage Vd (a voltage required to emit electrons) in series to the electron emitter 14.

The electron emitter 14 has a memory 18 for accumulating electric charges corresponding to the input voltage Vi output from the drive circuit 12, and emits electrons corresponding to the electric charges accumulated in the memory 18. The amplifier 16 has a collector electrode 20 for capturing the electrons emitted from the electron emitter 14. A positive power supply 22 is connected to the collector electrode 20 through a load 24. The atmosphere between at least the electron emitter 14 and the collector electrode 20 is a vacuum. A vacuum level in the atmosphere may preferably range from $10^2$ to $10^{-6}$ Pa and more preferably from $10^{-3}$ to $10^{-5}$ Pa. The vacuum in the atmosphere between the electron emitter 14 and the collector electrode 20 allows electrons emitted from the electron emitter 14 to move at a high speed to the collector electrode 20, and makes it unnecessary to increase the size of a support for structural members of the electron emitter 14 and a sealing section of the vacuum, allowing the electron emitter 14 to be reduced in size.

Structural details and the principles of electron emission of the electron emitter 14, which is one of the components of the microdevice 10, will be described below with reference to FIGS. 2 through 13.

The electron emitter 14 comprises a plate-shaped emitter 30 made of dielectric material, a first electrode (e.g., an upper electrode) 32 formed on a first surface (e.g., an upper surface) of the emitter 30, and a second electrode (e.g., a lower electrode) 34 formed on a second surface (e.g., a lower surface) of the emitter 30. The drive circuit 12 is connected such that the input voltage Vi and the drive voltage Vd from the drive circuit 12 are applied between the upper electrode 32 and the lower electrode 34. In the embodiment shown in FIG. 1, the drive circuit 12 and the electron emitter 14 are electrically connected with respect to GND (ground) as a reference. The upper electrode 32 of the electron emitter 14 is connected to an output terminal of the drive circuit 12, and the lower electrode 34 of the electron emitter 14 is connected to the GND. The microdevice 10 produces an output voltage Vo that is extracted from between an output terminal 36 of the amplifier 16 and the GND.

Figure 2:
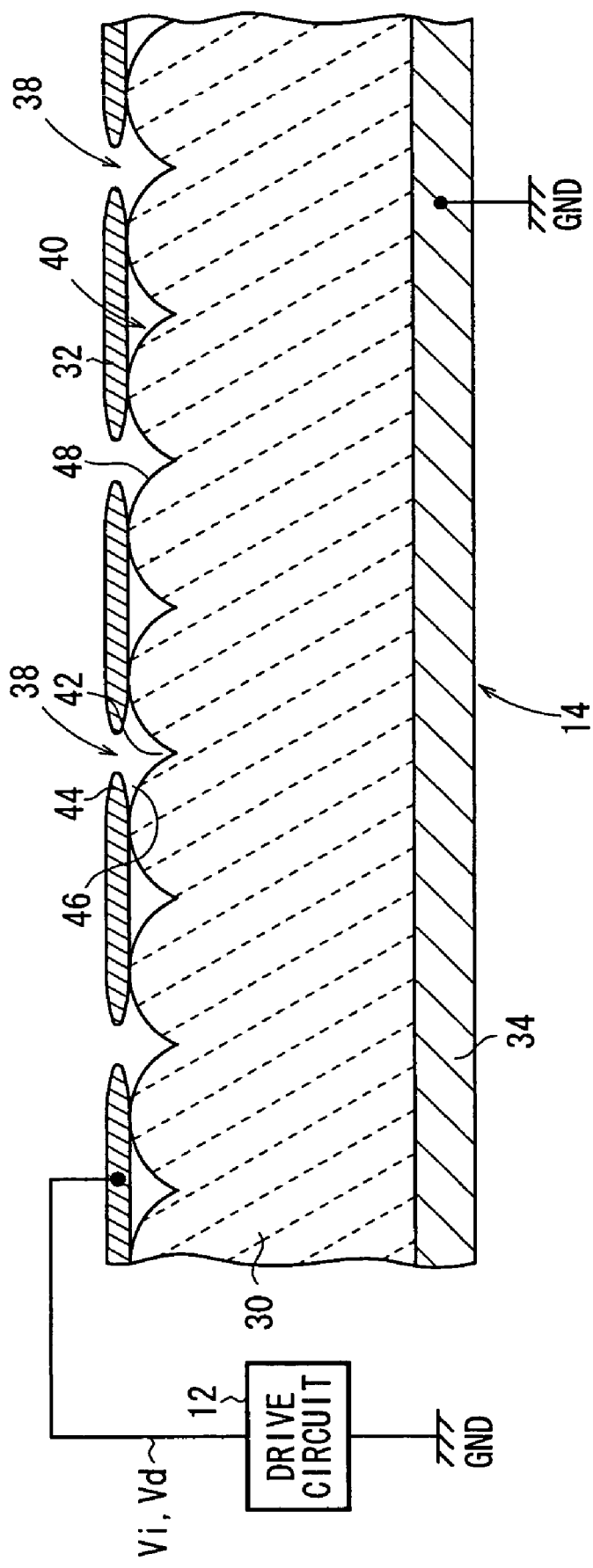
FIG. 2 is a fragmentary cross-sectional view of an electron emitter employed in the microdevice according to the above embodiment.

As shown at an enlarged scale in FIG. 2, the upper electrode 32 has a plurality of through regions 38 through which the emitter 30 is exposed. The emitter 30 has an uneven surface 40 on its surface based on the grain boundary of the dielectric material that the emitter 30 is made of. The through regions 38 of the upper electrode 32 are formed corresponding to notches (or concavities) 42 of the grain boundary of the dielectric material. In the embodiment shown in FIG. 2, one through region 38 is formed in association with one notch 42. However, one through region 38 may be formed in association with a plurality of notches 42. A particle diameter of the dielectric material of the emitter 30 may preferably range from 0.1 μm to 10 μm, and more preferably from 2 μm to 7 μm. In the embodiment shown in FIG. 2, the particle diameter of the dielectric material is of 3 μm.

Further, as shown in FIG. 3, the upper electrode 32 includes a peripheral portion 44 surrounding the through region 38 and having a surface 44a facing the emitter 30. The surface 44a is spaced from the emitter 30. Specifically, a gap 46 is formed between the emitter 30 and the surface 44a, facing the emitter 30, of the peripheral portion 44 of the through region 38, and the peripheral portion 44 of the through region 38 of the upper electrode 32 is formed as an overhanging portion (flange). In the following description, "the peripheral portion 44 of the through region 38 of the upper electrode 32" may be referred to as "the overhanging portion 44 of the upper electrode 32". In FIGS. 1-3, 5A, 5B, 6A, 6B, 8, 16, 18, 20, 22-24, 27, 32, and 33, protuberances (or projections) 48 of the uneven surface 40 of the grain boundary of the dielectric material are shown as having a semicircular cross-sectional shape (convexity). However, the protuberances 48 are not limited to the semicircular cross-sectional shape.

The upper electrode 32 of the electron emitter 14 has a thickness t in the range of 0.01 μm≦t≦10 μm, and the maximum angle θ between the upper surface of the emitter 30, i.e., the surface of the protuberance 48 (which is also an inner wall surface of the notch 42) of the grain boundary of the dielectric material, and the lower surface 44a of the overhanging portion 44 of the upper electrode 32 is in the range of 1°≦θ≦60°. The maximum distance d in the vertical direction between the surface of the protuberance 48 (the inner wall surface of the notch 42) of the grain boundary of the dielectric material and the lower surface 44a of the overhanging portion 44 of the upper electrode 32 is in the range of 0 μm<d≦10 μm.

In the electron emitter 14, shapes of the through regions 38, particularly shapes thereof as seen from above, are shapes of holes 50, as shown in FIG. 4, each of which may be a shape including a curve such as a circular shape, an elliptical shape and a track shape, or a polygonal shape such as a quadrangular shape and a triangular shape. In FIG. 4, each shape of the holes 50 is a circular shape.

The holes 50 have an average diameter ranging from 0.1 μm to 10 μm. The average diameter represents an average of lengths of a plurality of different line segments passing through each center of the holes 50.

Materials of various components of the electron emitter 14 will be described below. The dielectric material that the emitter 30 is made of may preferably be dielectric material having a relatively high dielectric constant, e.g., a dielectric constant of 1000 or higher. Dielectric materials of such a nature may be ceramics including barium titanate, lead zirconate, lead magnesium niobate, lead nickel niobate, lead zinc niobate, lead manganese niobate, lead magnesium tantalate, lead nickel tantalate, lead antimony stannate, lead titanate, lead magnesium tungstate, lead cobalt niobate, etc. or a combination of any of these materials, a material which mainly contains 50 weight % or more of any of these materials, or such ceramics to which there is added an oxide of such as lanthanum, calcium, strontium, molybdenum, tungsten, barium, niobium, zinc, nickel, manganese, or the like, or a combination of these materials, or any of other compounds.

For example, a two-component material nPMN-mPT (n, m represent molar ratios) of lead magnesium niobate (PMN) and lead titanate (PT) has its Curie point lowered for a larger specific dielectric constant at room temperature if the molar ratio of PMN is increased.

Particularly, a dielectric material where n=0.85 to 1.0 and m=1.0−n is preferable because its specific dielectric constant is 3000 or higher. For example, a dielectric material where n=0.91 and m=0.09 has a specific dielectric constant of 15000 at room temperature, and a dielectric material where n=0.95 and m=0.05 has a specific dielectric constant of 20000 at room temperature.

For increasing a specific dielectric constant of a three-component dielectric material of lead magnesium niobate (PMN), lead titanate (PT), and lead zirconate (PZ), it is preferable to achieve a composition close to a morphotropic phase boundary (MPB) between a tetragonal system and a quasi-cubic system or a tetragonal system and a rhombohedral system, as well as to increase the molar ratio of PMN. For example, a dielectric material where PMN:PT:PZ=0.375: 0.375:0.25 has a specific dielectric constant of 5500, and a dielectric material where PMN:PT:PZ=0.5:0.375:0.125 has a specific dielectric constant of 4500, which is particularly preferable. Further, it is preferable to increase the dielectric constant by introducing a metal such as platinum into these dielectric materials within a range to keep them insulative. For example, a dielectric material may be mixed with 20 weight % of platinum.

The emitter 30 may be in the form of a piezoelectric/electrostrictive layer or an antiferroelectric layer. If the emitter 30 comprises the piezoelectric/electrostrictive layer, it may be made of ceramics such as lead zirconate, lead magnesium niobate, lead nickel niobate, lead zinc niobate, lead manganese niobate, lead magnesium tantalate, lead nickel tantalate, lead antimony stannate, lead titanate, barium titanate, lead magnesium tungstate, lead cobalt niobate, or the like, or a combination of any of these materials.

The emitter 30 may be made of a main component including 50 wt % or more of any of the above compounds. Of the above ceramics, the ceramics including the lead zirconate is most frequently used as a constituent of the piezoelectric/electrostrictive layer of the emitter 30.

If the piezoelectric/electrostrictive layer is made of ceramics, then an oxide of lanthanum, calcium, strontium, molybdenum, tungsten, barium, niobium, zinc, nickel, manganese, or the like, or a combination of these materials, or any of other compounds may be added to the ceramics. Alternatively, ceramics produced by adding $SiO_2$, $CeO_2$, $Pb_5Ge_3O_{11}$, or a combination of any of these compounds to the above ceramics may be used. Specifically, a material produced by adding 0.2 wt % of $SiO_2$, 0.1 wt % of $CeO_2$, or 1 to 2 wt % of $Pb_5Ge_3O_{11}$ to the PT-PZ-PMN piezoelectric material is preferable.

For example, the piezoelectric/electrostrictive layer may preferably be made of ceramics including a main component consisting of lead magnesium niobate, lead zirconate and lead titanate, and also including lanthanum and/or strontium.

The piezoelectric/electrostrictive layer may be dense or porous. If the piezoelectric/electrostrictive layer is porous, it may preferably have a porosity of 40% or less.

If the emitter 30 is in the form of the antiferroelectric layer, the antiferroelectric layer may preferably include a main component consisting of lead zirconate or lead zirconate and lead stannate. Further, lanthanum oxide may preferably be added to the lead zirconate, and lead zirconate and/or lead niobate may preferably added to the lead zirconate and lead stannate.

The antiferroelectric layer may be porous. If the antiferroelectric layer is porous, it may preferably have a porosity of 30% or less.

If the emitter 30 is made of strontium tantalate bismuthate ($SrBi_2Ta_2O_9$), its polarization inversion fatigue is small. Materials whose polarization inversion fatigue is small are laminar ferroelectric compounds and expressed by a general formula of $(BiO_2)^{2+}(A_{m-1}B_mO_{3m+1})^{2-}$. Ions of the metal A may be $Ca^{2+}$, $Sr^{2+}$, $Ba^{2+}$, $Pb^{2+}$, $Bi^{3+}$ or $La^{3+}$, and ions of the metal B may be $Ti^{4+}$, $Ta^{5+}$, $Nb^{5+}$. An additive may be added to piezoelectric ceramics of barium titanate, lead zirconate, and PZT to convert them into a semiconductor. In this case, it is possible to provide an inhomogeneous electric field distribution in the emitter 30 to concentrate an electric field in the vicinity of an interface with the upper electrode 32 which contributes to the emission of electrons.

A firing temperature can be lowered by adding glass such as lead borosilicate glass or the like or other compounds of low melting point (e.g., bismuth oxide or the like) to the piezoelectric/electrostrictive/antiferroelectric ceramics.

If the emitter 30 is made of piezoelectric/electrostrictive/antiferroelectric ceramics, it may be a sheet-like single-layered body, a sheet-like multi-layered body, or either one of such bodies laminated or bonded to another support substrate.

The emitter 30 may be made of a lead-free material to have a high melting point or a high evaporation temperature so as to be less liable to be damaged by impingement of electrons or ions.

The emitter 30 may be made by any of various thick-film forming processes including screen printing, dipping, coating, electrophoresis, aerosol deposition, etc., or any of various thin-film forming processes including an ion beam process, sputtering, vacuum evaporation, ion plating, chemical vapor deposition (CVD), plating, etc. Particularly, it is preferable to form the emitter 30 by impregnating a powdery piezoelectric/electrostrictive material with glass of a low melting point or sol particles. According to this process, it is possible to form a film at a low temperature of 700° C. or lower or 600° C. or lower.

The upper electrode 32 is made of an organic metal paste which can produce a thin film after being fired. For example, a platinum resinate paste or the like may preferably be used. An oxide electrode for suppressing a polarization inversion fatigue, which is made of ruthenium oxide ($RuO_2$), iridium oxide ($IrO_2$), strontium ruthenate ($SrRuO_3$), $La_{1-x}Sr_xCoO_3$ (e.g., x=0.3 or 0.5), $La_{1-x}Ca_xMnO_3$ (e.g., x=0.2), $La_{1-x}Ca_xMn_{1-y}Co_yO_3$ (e.g., x=0.2, y=0.05), or a mixture of any one of these compounds with, for example, the platinum resinate paste, is preferable.

As shown in FIGS. 5A and 5B, the upper electrode 32 may preferably be in the form of a cluster 54 of a plurality of scale-like members 52 (e.g., of graphite). Alternatively, as shown in FIGS. 6A and 6B, the upper electrode 32 may preferably be in the form of a cluster 58 of electrically conductive members 56 including scale-like members 52. The cluster 54 or 58 does not fully cover the surface of the emitter 30, but a plurality of through regions 38 are provided through which the emitter 30 is partly exposed, and those portions of the emitter 30 which face the through regions 38 serve as electron emission regions.

The upper electrode 32 may be made of any of the above materials by any of thick-film forming processes including screen printing, spray coating, coating, dipping, electrophoresis, etc., or any of various thin-film forming processes including sputtering, an ion beam process, vacuum evaporation, ion plating, chemical vapor deposition (CVD), plating, etc. Preferably, the upper electrode 32 is made by any of the above thick-film forming processes.

The lower electrode 34 is made of an electrically conductive material, e.g., a metal such as platinum, molybdenum, and tungsten. Alternatively, the lower electrode 34 may be made of an electric conductor which is resistant to a high-temperature oxidizing atmosphere, e.g., a metal, an alloy, a mixture of insulative ceramics and a metal, and, a mixture of insulative ceramics and an alloy. Preferably, the lower electrode 34 may be made of a precious metal having a high melting point such as platinum, iridium, palladium, rhodium, molybdenum, or a material mainly composed of an alloy of silver and palladium, silver and platinum, platinum and palladium, or a cermet of platinum and ceramics. Further preferably, the lower electrode 34 may be made of platinum only or a material mainly composed of a platinum-base alloy.

The lower electrode 34 may also be made of carbon or a graphite-base material. Ceramics to be added to the electrode material may preferably have a proportion ranging from 5 to 30 volume %. The lower electrode 34 may be made of the same material as the upper electrode 32, as described above.

The lower electrode 34 may preferably be formed by any of the above various thick-film forming processes. The lower electrode 34 has a thickness of 20 μm or less, and preferably a thickness of 5 μm or less.

Each time the emitter 30, the upper electrode 32, or the lower electrode 34 is formed, the assembly is heated (sintered) into an integral structure.

The sintering process for integrally combining the emitter 30, the upper electrode 32, and the lower electrode 34 may be carried out at a temperature ranging from 500° to 1400° C., preferably from 1000° to 1400° C. For heating the emitter 30 which is in the form of a film, the emitter 30 may preferably be sintered together with its evaporation source while their atmosphere is being controlled, so that the composition of the emitter 30 will not become unstable at high temperatures.

By performing the sintering process, the film which will serve as the upper electrode 32 is shrunk from the thickness of 10 μm to the thickness of 0.1 μm, and simultaneously a plurality of holes are formed therein. As a result, as shown in FIG. 2, a plurality of through regions 38 are formed in the upper electrode 32, and the peripheral portions 44 of the through regions 38 are turned into overhanging portions. In advance (before the sintering process), the film which will serve as the upper electrode 32 may be patterned by etching (wet etching or dry etching) or lift-off, and then may be sintered. In this case, notches or slits may easily be formed as the through regions 38.

The emitter 30 may be covered with a suitable member, and then sintered such that the surface of the emitter 30 will not be exposed directly to the sintering atmosphere.

The principles of electron emission of the electron emitter 14 will be described below. First, a voltage is applied between the upper electrode 32 and the lower electrode 34. The voltage is defined as a voltage, such as a pulse voltage or an alternating voltage, which abruptly changes with time from a voltage level that is higher or lower than a reference voltage (e.g., 0 V) to a voltage level that is lower or higher than the reference voltage. Alternatively, a voltage having a voltage level that is higher or lower than the reference voltage and a voltage having a voltage level that is lower or higher than the reference voltage may be supplied from respective different systems. In this embodiment, the input voltage Vi and the drive voltage Vd are supplied in series from the drive circuit 12 to the electron emitter 14.

A triple junction is formed in a region of contact between the upper surface of the emitter 30, the upper electrode 32, and a medium (e.g., a vacuum) around the electron emitter 14. The triple junction is defined as an electric field concentration region formed by contact between the upper electrode 32, the emitter 30, and the vacuum. The triple junction includes a triple point where the upper electrode 32, the emitter 30, and the vacuum exist as one point.

In the electron emitter 14, the triple junction is formed on the overhanging portion 44 of the upper electrode 32 and a peripheral area of the upper electrode 32. Therefore, when the voltage is applied between the upper electrode 32 and the lower electrode 34, an electric field concentration occurs at the triple junction.

Figure 7:
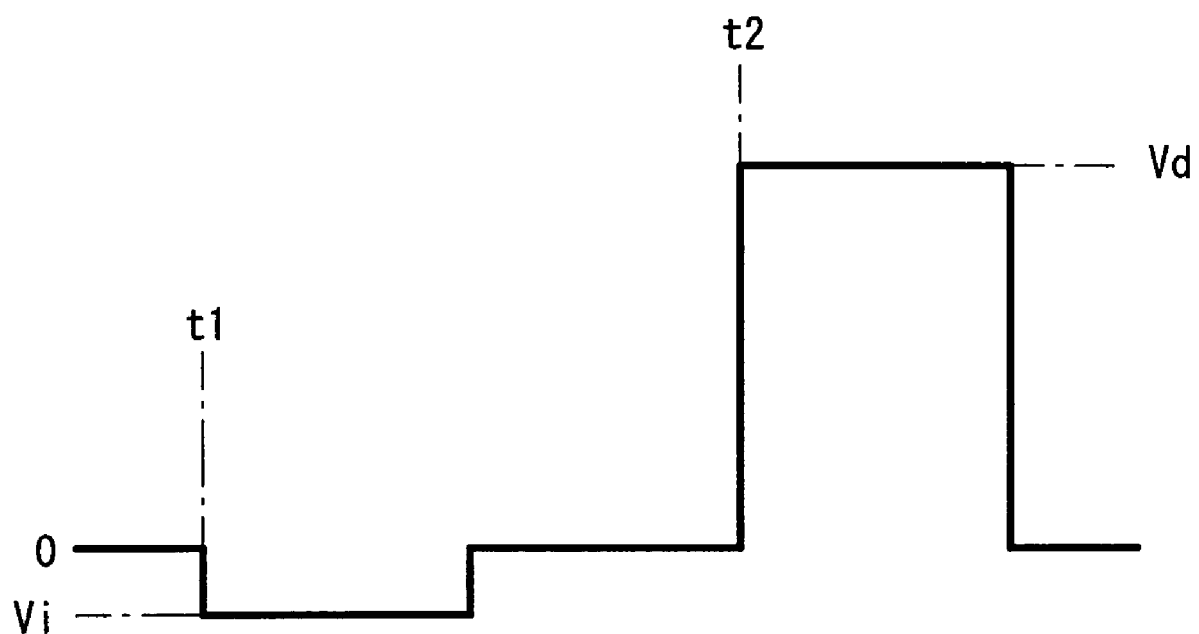
FIG. 7 is a waveform diagram showing an input voltage and a drive voltage output from a drive circuit.
Figure 8:
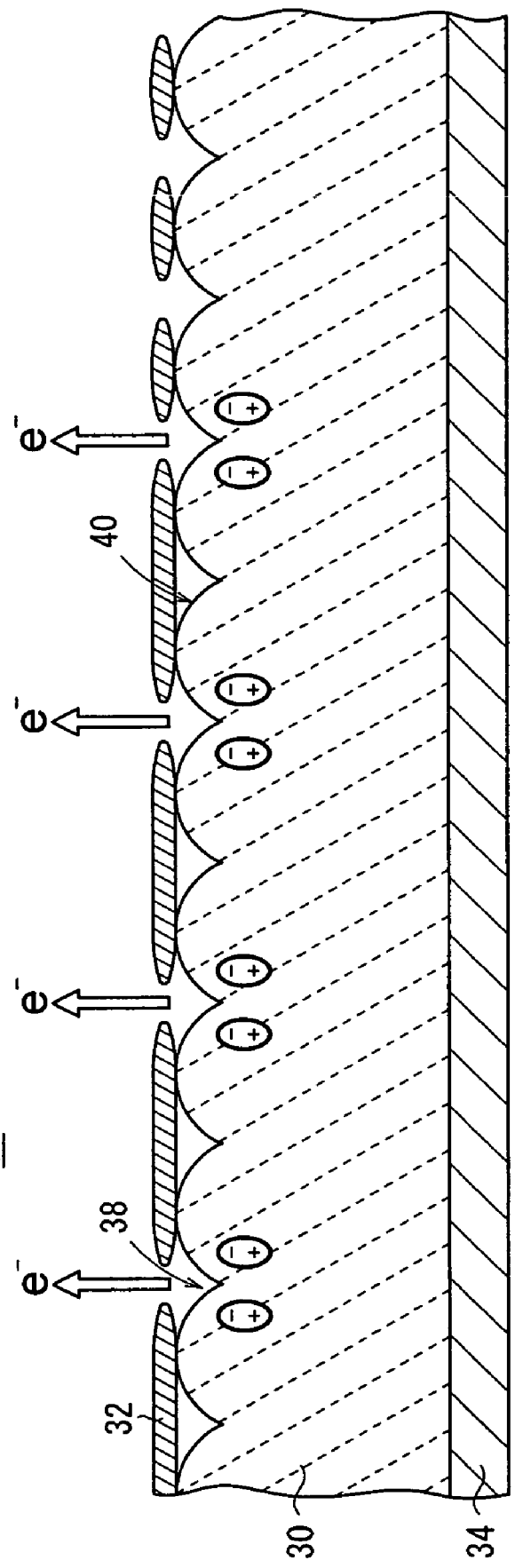
FIG. 8 is a view illustrative of a manner in which electrons are emitted from the electron emitter when a drive voltage is applied to the electron emitter.

An electron emission process for the electron emitter 14 will be described below with reference to FIGS. 7 and 8. At time t1 (first stage) shown in FIG. 7, the input voltage Vi from the drive circuit 12 is applied to the electron emitter 14. At this time, the input voltage Vi which is lower than a reference voltage (e.g., 0 V) is applied to the upper electrode 32, and the reference voltage is applied to the lower electrode 34. When the input voltage Vi is applied to the electron emitter 14, an electric field concentration occurs at the triple junction referred to above and/or the tip end of the overhanging portion 44 of the upper electrode 32, causing the upper electrode 32 to emit electrons toward the emitter 30. The emitted electrons are accumulated in portions of the emitter 30 which are exposed through the through region 38 of the upper electrode 32 and regions near an outer peripheral portion of the upper electrode 32. At this time, portions of the emitter 30 where the electrons are accumulated function as a memory 18 (see FIG. 1), and the upper electrode 32 functions as an electron supply source.

At time t2 (second stage) after the input voltage Vi is applied, the drive voltage Vd from the drive circuit 12 is applied to the electron emitter 14. At this time, the drive voltage Vd that is higher than the reference voltage is applied to the upper electrode 32, and the reference voltage is applied to the lower electrode 34. The electrons accumulated in the portions of the upper electrode 32 which correspond to the through regions 38 and the regions near the outer peripheral portion of the upper electrode 32 are now expelled from the emitter 30 by dipoles (whose negative poles appear on the surface of the emitter 30) in the emitter 30 whose polarization has been inverted in the opposite direction. As shown in FIG. 8, the electrons are emitted from the portions of the emitter 30 where the electrons have been accumulated, through the through regions 38. The electrons are also emitted from the regions near the outer peripheral portion of the upper electrode 32.

Figure 9:
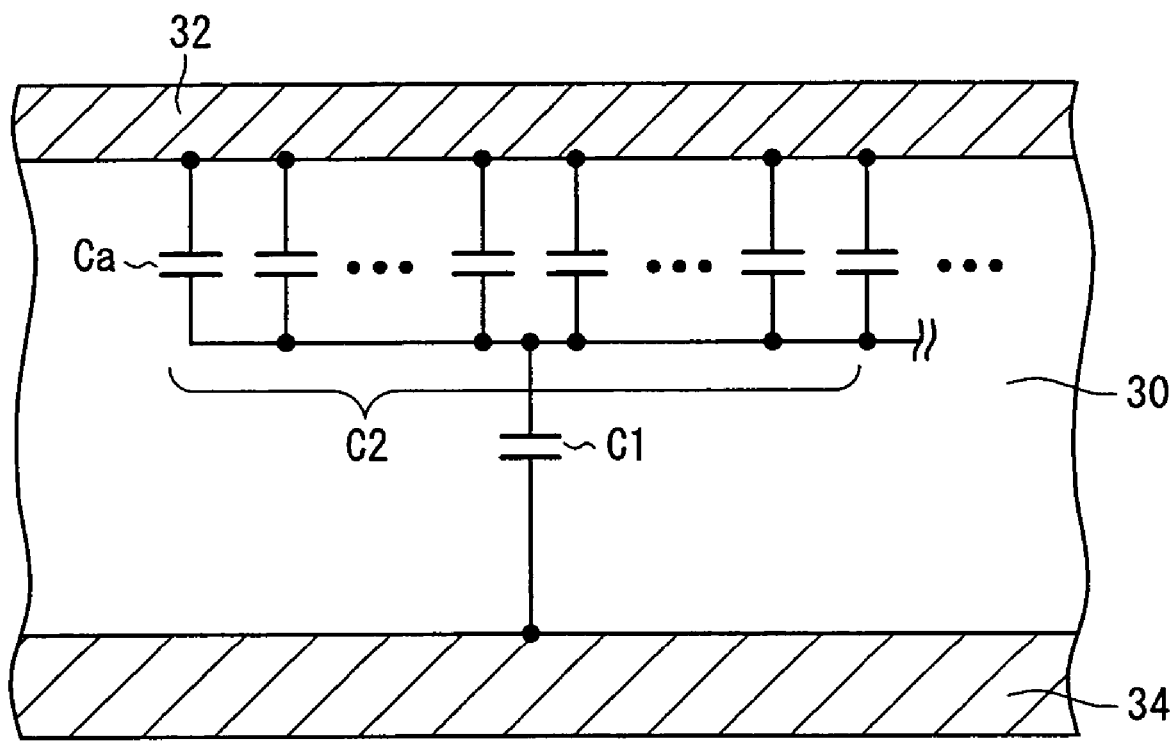
FIG. 9 is an equivalent circuit diagram showing a connected state of various capacitors connected between the upper electrode and a lower electrode.

As shown in FIG. 9, the electron emitter 14 has in its electrical operation a capacitor C1 formed from the emitter 30 and a cluster of capacitors Ca formed from respective gaps 46 (see FIG. 3), disposed between the upper electrode 32 and the lower electrode 34. In other words, the capacitors Ca of the respective gaps 46 constitute a single capacitor C2, in which the capacitors Ca are connected parallel to each other. In terms of an equivalent circuit, the capacitor C1 of the emitter 30 is connected in series to the capacitor C2 which comprises the cluster of capacitors Ca.

Actually, a partial component of the capacitor C1 of the emitter 30 is not connected in series to the capacitor C2 which comprises the cluster of capacitors Ca, but a capacitive component that is connected in series varies depending on the number of the through regions 38 formed in the upper electrode 32 and the overall area of the through regions 38.

Figure 10:
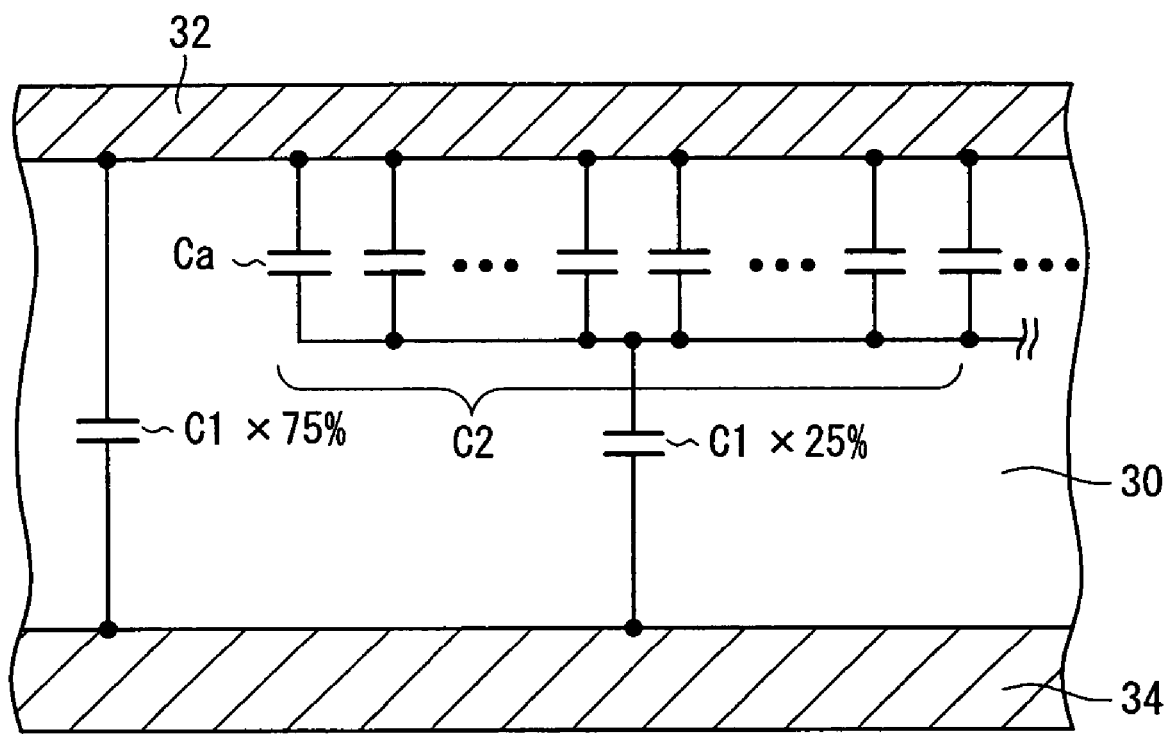
FIG. 10 is a diagram illustrative of calculations of capacitances of the various capacitors connected between the upper electrode and the lower electrode.

As shown in FIG. 10, capacitance calculations will be performed on the assumption that 25% of the capacitor C1 of the emitter 30 is connected in series to the capacitor C2 which comprises the cluster of capacitors Ca. Since the gaps 46 are in vacuum, a relative dielectric constant thereof is 1. It is assumed that the maximum distance d across each gap 46 is 0.1 µm, an area S of each gap 46 is S=1 µm×1 µm, and the number of the gaps 46 is 10,000. It is also assumed that the emitter 30 has a relative dielectric constant of 2000, the emitter 30 has a thickness of 20 µm, and a confronting area of the upper and lower electrodes 32, 34 is 200 µm×200 µm. The capacitor C2 which comprises the cluster of capacitors Ca has a capacitance of 0.885 pF, and the capacitor C1 of the emitter 30 has a capacitance of 35.4 pF. If the portion of the capacitor C1 of the emitter 30 which is connected in series to the capacitor C2 which comprises the cluster of capacitors Ca is 25% of the entire capacitor C1, then that series-connected portion has a capacitance (including the capacitance of capacitor C2 which comprises the cluster of capacitors Ca) of 0.805 pF, and the remaining portion has a capacitance of 26.6 pF.

Since the series-connected portion and the remaining portion are connected parallel to each other, the overall capacitance is 27.5 pF. This capacitance is 78% of the capacitance 35.4 pF of the capacitor C1 of the emitter 30. Therefore, the overall capacitance is smaller than the capacitance of the capacitor C1 of the emitter 30.

Consequently, the capacitance of the cluster of capacitors Ca of the gaps 46 is relatively small. Because of voltage division between the cluster of capacitors Ca and the capacitor C1 of the emitter 30, almost the entire applied voltage Vd is applied across the gaps 46, which are effective for each gap 46 to produce a higher output of the electron emission.

Since the capacitor C2 comprising the cluster of capacitors Ca is connected in series to the capacitor C1 of the emitter 30, the overall capacitance is smaller than the capacitance of the capacitor C1 of the emitter 30. This is effective to provide such preferred characteristics that the electron emission is performed for a higher output and the overall power consumption is lower.

Characteristics of the electron emitter 14, especially voltage vs. charge quantity characteristics (voltage vs. polarized quantity characteristics) thereof will be described below.

Figure 11:
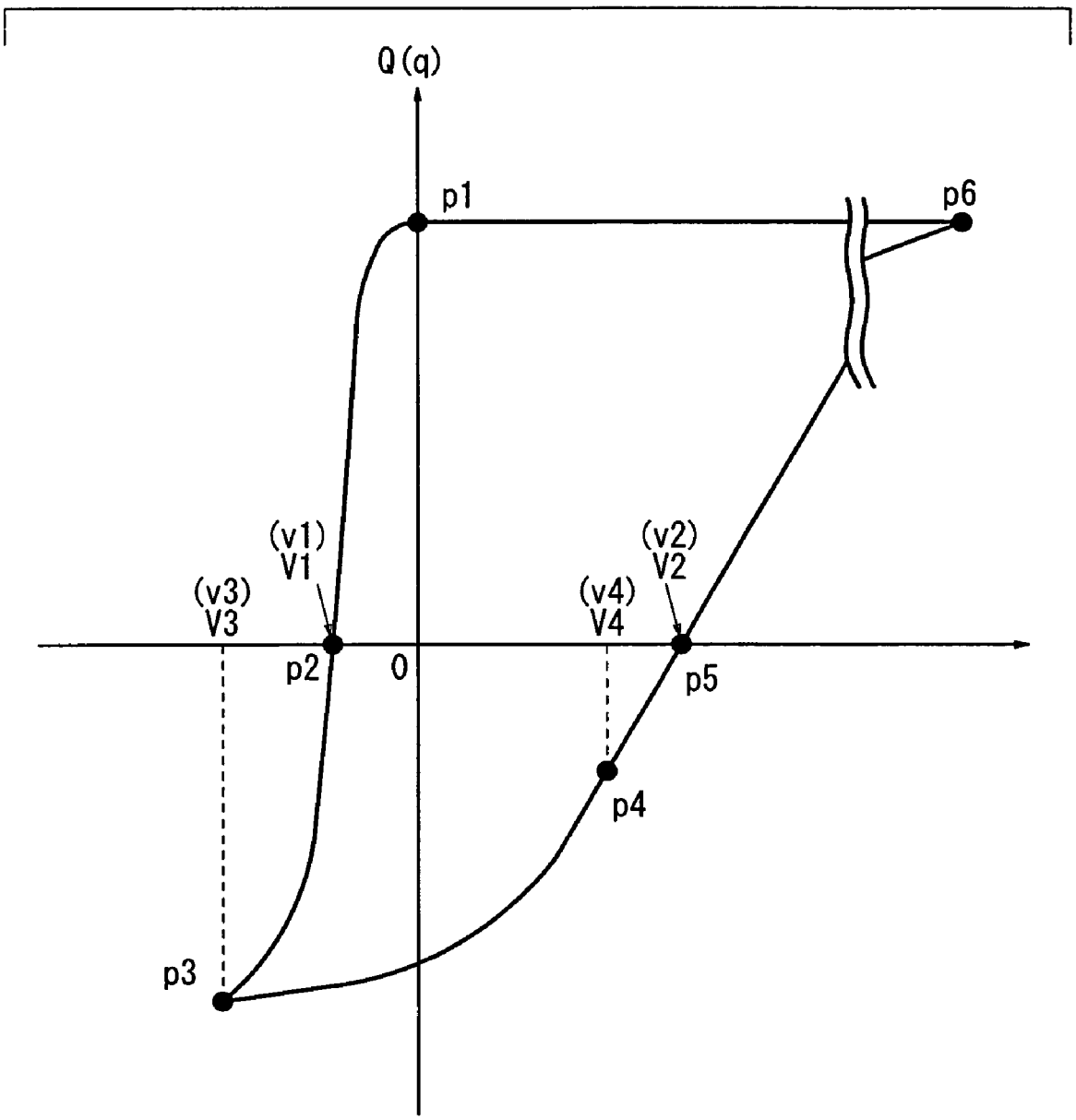
FIG. 11 is a diagram showing voltage vs. charge quantity characteristics (voltage vs. polarized quantity characteristics) of the electron emitter.

The electron emitter 14 is characterized by an asymmetric hysteresis curve based on the reference voltage=0 (V) in vacuum, as indicated by the characteristics shown in FIG. 11.

The voltage vs. charge quantity characteristics will be described below. If a region of the emitter 30 from which electrons are emitted is defined as an electron emission region, then at a point p1 (initial state) where the reference voltage is applied, almost no electron is stored in the electron emission region. Thereafter, when a negative voltage is applied, an amount of positive charges of dipoles whose polarization is inverted in the emitter 30 in the electron emission region increases, and electrons are emitted from the upper electrode 32 toward the electron emission region in the first stage, so that electrons are stored. When a level of the negative voltage decreases in a negative direction, electrons are progressively stored in the electron emission region until the amounts of the positive and negative charges are held in equilibrium with each other at a point p2 of the negative voltage. As the level of the negative voltage further decreases in the negative direction, the stored amount of the electrons increases, making the amount of the negative charges greater than the amount of the positive charges. The accumulation of the electrons is saturated at a point P3. The amount of the negative charges is the sum of the amount of electrons remaining to be stored and the amount of negative charges of the dipoles whose polarization is inverted in the emitter 30.

As the level of the negative voltage increases, and a positive voltage is applied in excess of the reference voltage, electrons start being emitted at a point p4 in the second stage. When the positive voltage increases in a positive direction, the amount of emitted electrons increases until the amounts of the positive and negative charges are held in equilibrium with each other at a point p5. At a point p6, almost all the stored electrons are emitted, bringing the difference between the amounts of the positive and negative charges into substantial conformity with a value in the initial state. That is, almost all the stored electrons are eliminated, and only the negative charges of the dipoles whose polarization is inverted in the emitter 30 appear in the electron emission region.

The voltage vs. charge quantity characteristics have the following features:

(1) If the negative voltage at the point p2 where the amounts of the positive and negative charges are held in equilibrium with each other is represented by V1 and the positive voltage at the point p5 by V2, then these voltages satisfy the following relationship:

$|V1|<|V2|$ (2) More specifically, the relationship is expressed as $1.5 \times |V1| < |V2|$ (3) If a rate of change of the amounts of the positive and negative charges at the point p2 is represented by $\Delta Q1/\Delta V1$ and a rate of change of the amounts of the positive and negative charges at the point p5 by $\Delta Q2/\Delta V2$, then these rates satisfy the following relationship:

$(\Delta Q1/\Delta V1) > (\Delta Q2/\Delta V2)$ (4) If the voltage at which the accumulation of electrons is saturated is represented by V3 and the voltage at which electrons start being emitted by V4, then these voltages satisfy the following relationship:

$$1 \leq |V4|/|V3| \leq 1.5$$

The characteristics shown in FIG. 11 will be described below in terms of the voltage vs. polarization quantity characteristics. It is assumed that the emitter 30 is polarized in one direction, with the dipoles having negative poles facing toward the upper surface of the emitter 30 (see FIG. 12A).

Figure 12A:
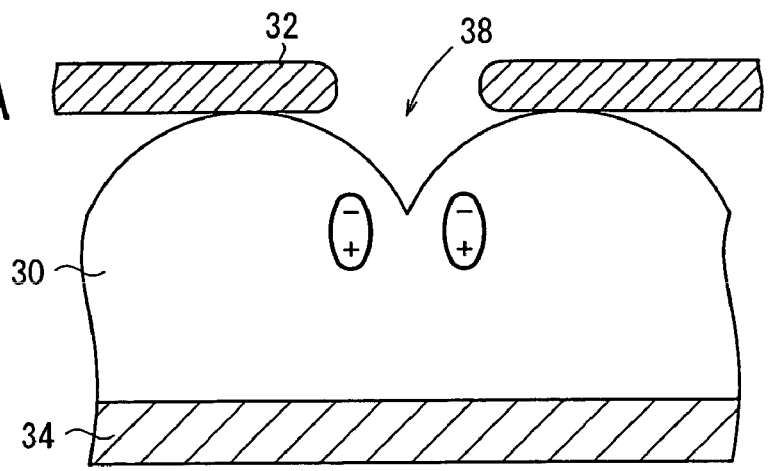
FIG. 12A is a view illustrative of a state at a point p1 shown in FIG. 11.
Figure 12B:
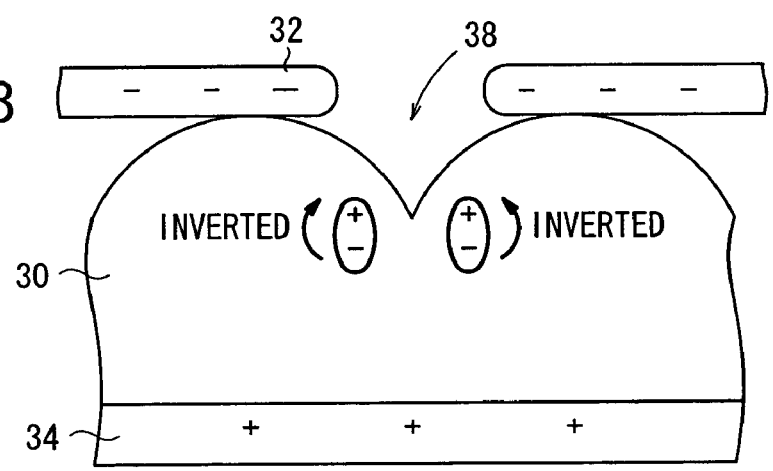
FIG. 12B is a view illustrative of a state at a point p2 shown in FIG. 11.
Figure 12C:
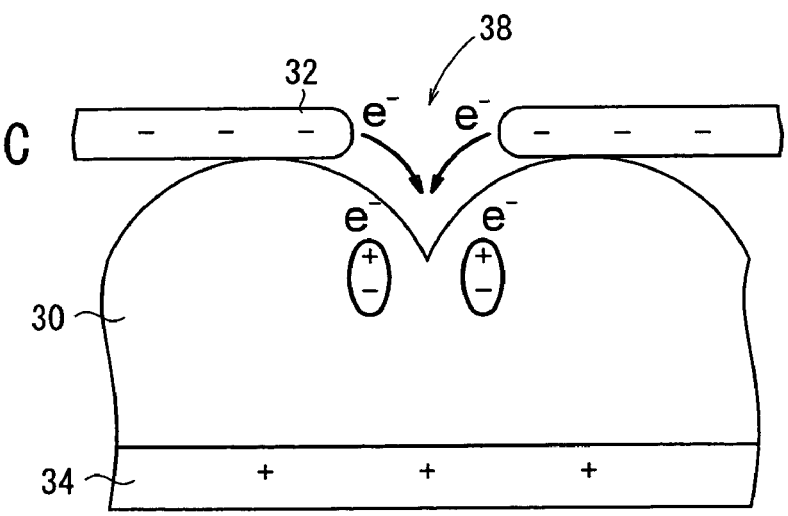
FIG. 12C is a view illustrative of a state from the point p2 to a point p3 shown in FIG. 11.

At the point p1 (initial state) where the reference voltage (e.g., 0 V) is applied as shown in FIG. 11, since the negative poles of the dipoles face toward the upper surface of the emitter 30, as shown in FIG. 12A, almost no electron is accumulated on the upper surface of the emitter 30.

Thereafter, when the negative voltage is applied and the level of the negative voltage is decreased in the negative direction, the polarization starts being inverted substantially at the time the negative voltage exceeds a negative coercive voltage (see the point p2 in FIG. 11). All the polarization is inverted at the point p3 shown in FIG. 11 (see FIG. 12B). Because of the polarization inversion, an electric field concentration occurs at the triple junction and/or the tip end of the overhanging portion 44 of the upper electrode 32, and the upper electrode 32 emits electrons toward the emitter 30 in the first stage, causing the electrons to be accumulated in the portions of the emitter 30 which are exposed through the through regions 38 of the upper electrode 32 and the portions of the emitter 30 which are near the peripheral portions of the upper electrode 32 (see FIG. 12C). In particular, the electrons are emitted (emitted inwardly) from the upper electrode 32 toward the portions of the emitter 30 which are exposed through the through regions 38 of the upper electrode 32. At the point p3 shown in FIG. 11, the accumulation of the electrons is saturated.

Figure 13A:
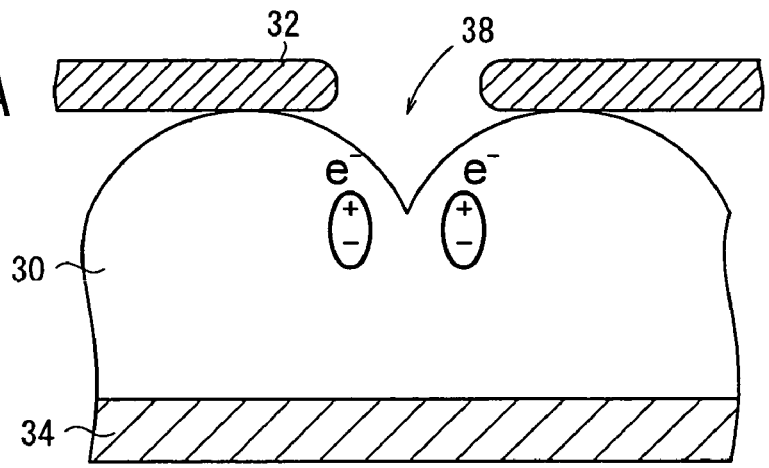
FIG. 13A is a view illustrative of a state from the point p3 to a point p4 shown in FIG. 11.
Figure 13B:
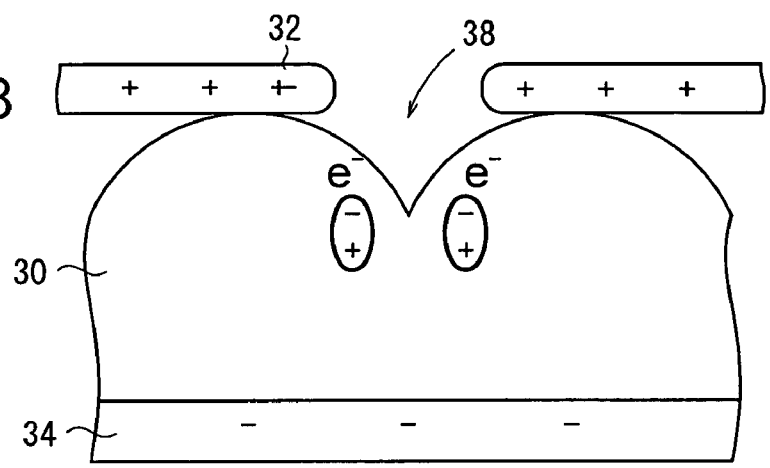
FIG. 13B is a view illustrative of a state just before a point p4 shown in FIG. 11.
Figure 13C:
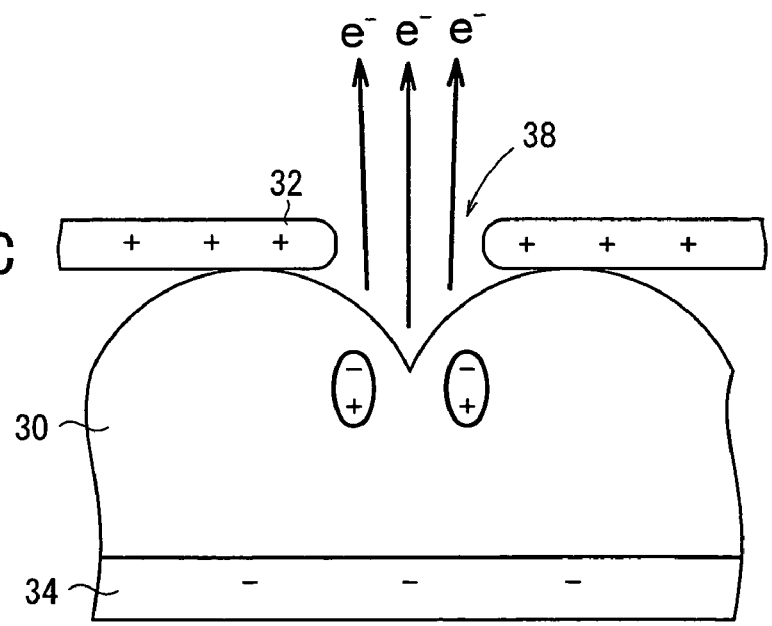
FIG. 13C is a view illustrative of a state from the point p4 to a point p6 shown in FIG. 11.

Thereafter, when the level of the negative voltage is reduced and the positive voltage is applied in excess of the reference voltage, the upper surface of the emitter 30 is kept charged up to a certain voltage level (see FIG. 13A). As the level of the positive voltage is increased, there is produced a region where the negative poles of the dipoles start facing the upper surface of the emitter 30 (see FIG. 13B) just before the point p4 in FIG. 11. When the level of the positive voltage is further increased, the electrons start being emitted due to coulomb repulsive forces posed by the negative poles of the dipoles after the point p4 in FIG. 11 (see FIG. 13C). When the positive voltage is increased in the positive direction, the amount of the emitted electrons is increased. Substantially at the time the positive voltage exceeds the positive coercive voltage (the point p5), a region where the polarization is inverted again is increased. At the point p6, almost all the accumulated electrons are emitted, and the amount of the polarization at this time is essentially the same as the amount of the polarization in the initial state.

The characteristics of the electron emitter 14 have the following features:

(A) If the negative coercive voltage is represented by v1 and the positive coercive voltage by v2, then these voltages satisfy the following relationship:

$$|v1| < |v2|$$

(B) More specifically, the relationship is expressed as $$1.5 \times |v1| < |v2|$$

(C) If a rate of change of the polarization at the time the negative coercive voltage v1 is applied is represented by $\Delta q1/\Delta v1$ and a rate of change of the polarization at the time the positive coercive voltage v2 is applied is represented by $\Delta q2/\Delta v2$, then these rates satisfy the following relationship:

$$(\Delta q1/\Delta v1) > (\Delta q2/\Delta v2)$$

(D) If the voltage at which the accumulation of the electrons is saturated is represented by v3 and the voltage at which the electrons start being emitted by v4, then these voltages satisfy the following relationship:

$$1 \leq |v4|/|v3| \leq 1.5$$

Since the electron emitter 14 has the characteristics shown in FIG. 11 as described above, it can easily be applied to a memory device and an analog switch as described later.

An operation of the microdevice 10 according to this embodiment will be described below with reference to FIG. 1. First, when the input voltage Vi from the drive circuit 12 is applied between the upper electrode 32 and the lower electrode 34 of the electron emitter 14, electric charges corresponding to the input voltage Vi are accumulated in the memory 18 of the electron emitter 14, as described above. When the drive voltage Vd from the drive circuit 12 is subsequently applied between the upper electrode 32 and the lower electrode 34 of the electron emitter 14, electrons corresponding to the electric charges accumulated in the memory 18 of the electron emitter 14 are emitted from the electron emitter 14. The electrons emitted from the electron emitter 14 are captured by the collector electrode 20 of the amplifier 16. At this time, a current (collector current Ic) flows between the collector electrode 20 and the electron emitter 14, and an amplification process is performed by the collector current Ic.

Figure 14:
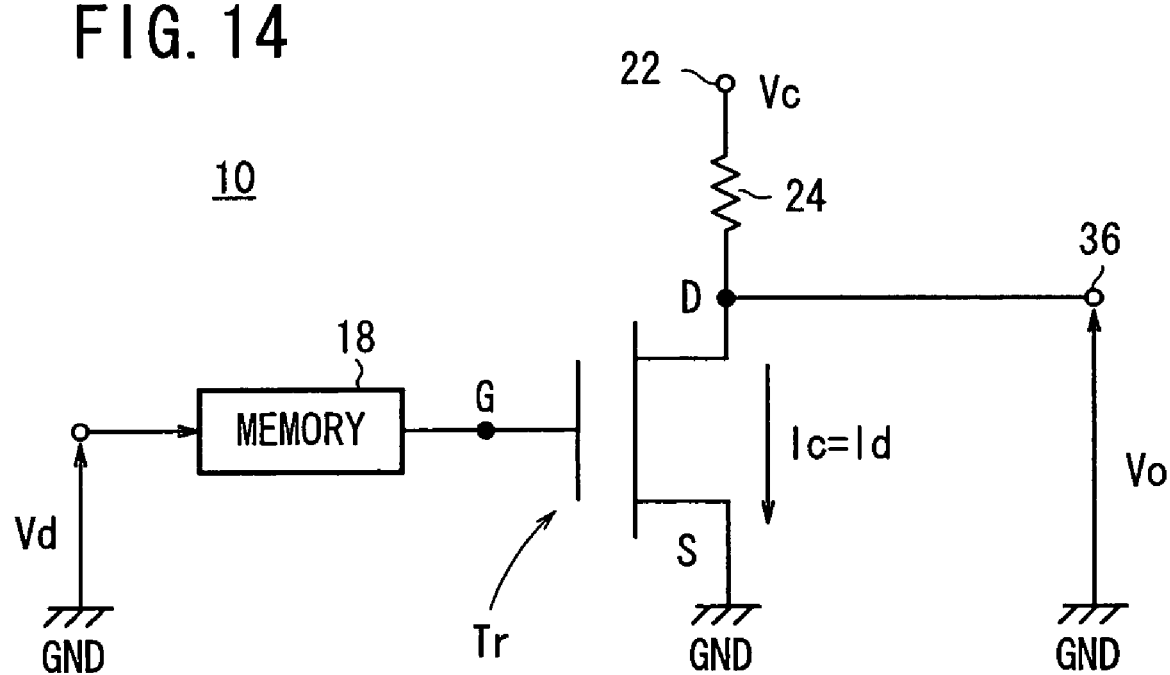
FIG. 14 is a diagram showing the microdevice as an equivalent circuit when the electron emitter emits electrons.

An equivalent circuit representative of an operation of the microdevice 10 during the emission of electrons from the electron emitter 14 comprises, as shown in FIG. 14, a field effect transistor Tr having a drain D provided by the collector electrode 20, a gate G by the memory 18, and a source S by the GND. When a voltage corresponding to the electric charges accumulated in the memory 18 is applied to the gate G of the transistor Tr, a drain current Id (=collector current Ic) flows between the drain D and the source S of the transistor Tr through the collector electrode 20. With the load 24 connected to the collector electrode 20, a voltage drop is developed across the load 24 and extracted as an output voltage (amplified voltage) Vo from the output terminal 36.

Figure 15:
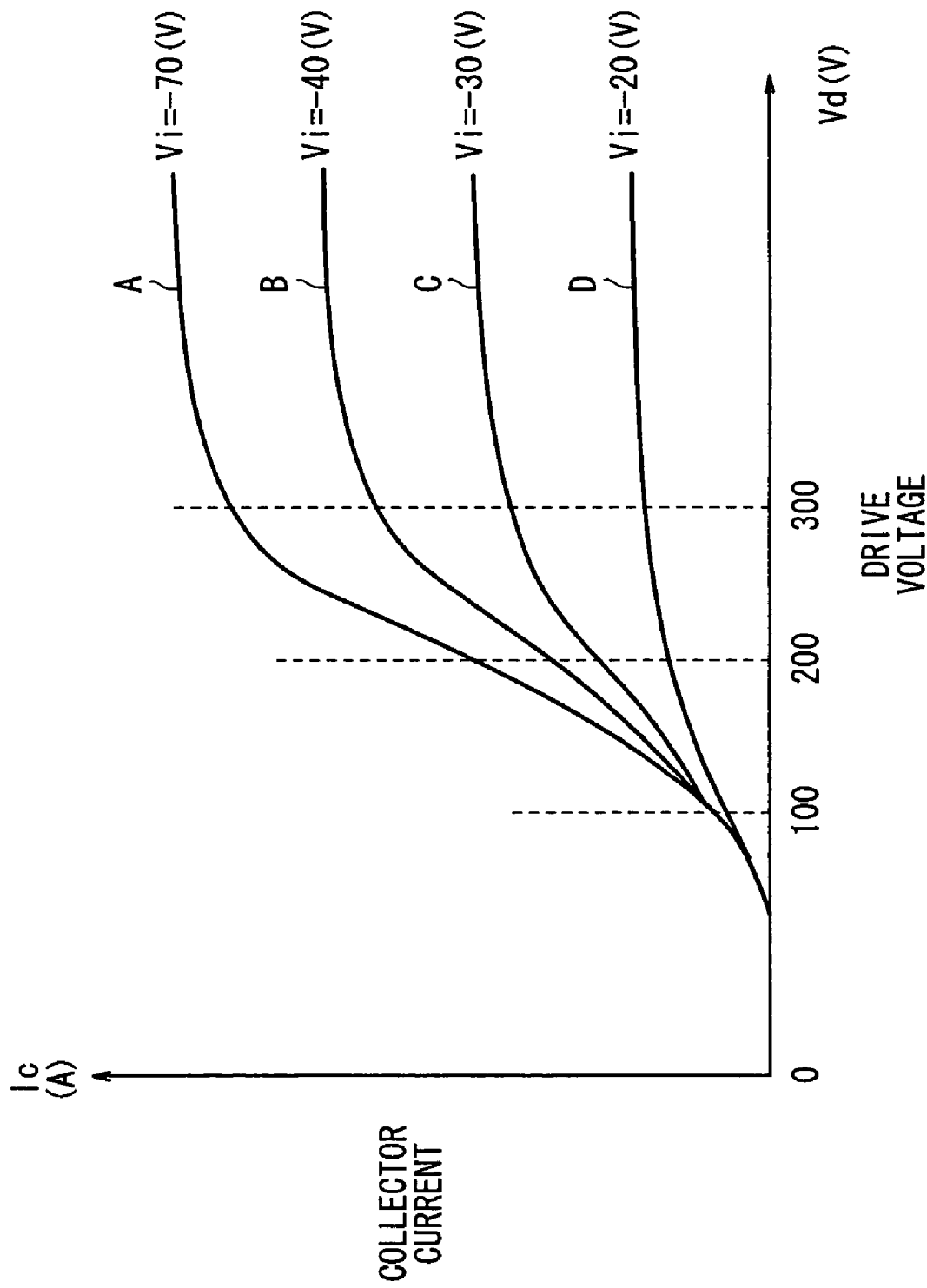
FIG. 15 is a diagram showing output characteristics (drive voltage vs. collector current characteristics) of the microdevice according to the above embodiment.

Output characteristics (drive voltage Vd vs. collector current Ic characteristics) of the microdevice 10 will be described below with reference to FIG. 15. The output characteristics are characteristics obtained when a film thickness of the emitter 30 of the electronic emitter 14 is 20 µm. In FIG. 15, a characteristic curve A represents output characteristics plotted when the input voltage Vi=−70 V, a characteristic curve B represents output characteristics plotted when the input voltage Vi=−40 V, a characteristic curve C represents output characteristics plotted when the input voltage Vi=−30 V, and a characteristic curve d represents output characteristics plotted when the input voltage Vi=−20 V.

It can be seen from the output characteristics shown in FIG. 15 that as an absolute value of the input voltage Vi is larger, the value of the collector current Ic is larger under the same drive voltage Vd (ex., 200 V), and the collector current Ic is not saturated when the drive voltage Vd is in the range from 0 to about 300 V, and is saturated when the drive voltage Vd is in excess of 300 V. The output characteristics of the microdevice 10 are highly similar to those of a transistor.

When the drive voltage Vd is in the range below 300 V, an output dynamic range of the microdevice 10 can be controlled by controlling the level of the drive voltage Vd.

In the example shown in FIG. 15, the thickness of the emitter 30 is 20 μm. However, if the thickness of the emitter 30 is reduced to about 2 μm, then the microdevice 10 can have output characteristics which are substantially the same as those shown in FIG. 15 when input voltages Vi of –2 V, –3 V, –4 V, and –7 V are applied. In other words, a voltage level used in logic circuits (ranging from 0 to 10 V) can be used as the level of the input voltage Vi.

In the microdevice 10, the electron emitter 14 operates in the same manner as a transistor. However, unlike a transistor in the form of a semiconductor, the power supply 22 having a power supply voltage which is about 1000 times (e.g., about 10 kV) as high as a logic level voltage can be connected to the collector electrode 20. Therefore, the output dynamic range of the microdevice 10 can be 1000 times as large as the input dynamic range thereof. This leads to a reduction in the input voltage Vi such that a voltage level used in logic circuits (ranging from 0 to 10 V) can be used as the level of the input voltage Vi. Consequently, the drive circuit 12 for supplying the input voltage Vi to the electron emitter 14 may be operated under a lower voltage for lower power consumption.

In the microdevice 10, the atmosphere between at least the electron emitter 14 and the collector electrode 20 is a vacuum. In a transistor in the form of a semiconductor, electrons move in a semiconductor crystal. According to the present embodiment, since electrons move in the vacuum, they can move faster than in the semiconductor. Since the collector current Ic according to this embodiment flows faster than in the semiconductor, the microdevice 10 can respond to an input signal at a high speed.

In the microdevice 10 according to this embodiment, the electron emitter 14 can be applied to an electronic circuit other than light sources and display apparatus, such as an amplifying circuit having a memory function, a memory device, an analog switch, or the like, as described later. Further, the microdevice 10 has the output dynamic range that is about 1000 times as large as the input dynamic range thereof and is capable of responding to an input signal at a high speed.

Furthermore, because the atmosphere between at least the electron emitter 14 and the collector electrode 20 is a vacuum, the microdevice 10 according to this embodiment is useful as an environment-resistant device and can operate in a wide range of temperatures and humidity. For example, the microdevice 10 can operate in a temperature range from –55° to 110° C.

A microdevice array according to an embodiment of the present invention can be constructed of a two-dimensional array of the microdevices 10 according to the embodiment described above. The microdevice array (not shown) comprises a first substrate which supports thereon the two-dimensional array of the microdevices 10 according to the above embodiment, a second substrate which supports thereon a two-dimensional array of collector electrodes 20, and a power supply 22, with a vacuum in the atmosphere between at least the first substrate and the second substrate. The first substrate also has, in addition to the two-dimensional array of the microdevices 10, interconnects interconnecting the microdevices 10 and interconnects interconnecting the microdevices 10 and input/output terminals. The collector electrodes 20 on the second substrate are positioned in alignment with the respective microdevices 10 on the first substrate, and the second substrate has interconnects interconnecting the collector electrodes 20 and input/output terminals. The power supply 22 is connected to the collector electrodes 20, making up the amplifier 16.

The microdevice array according to this embodiment is easily applicable to an amplifying circuit having a memory function, a memory device, an analog switch, or the like. In addition, the microdevice array has an output dynamic range that is about 1000 times as large as an input dynamic range thereof and is capable of responding to an input signal at a high speed. Since straightness of motion of electrons emitted from each of the electron emitters 14 can be improved, crosstalk between the microdevices 10 is reduced, allowing them to be highly integrated together.

Applications of the microdevice 10 according to the embodiment described above will be described below with reference to FIGS. 16 through 21.

Figure 16:
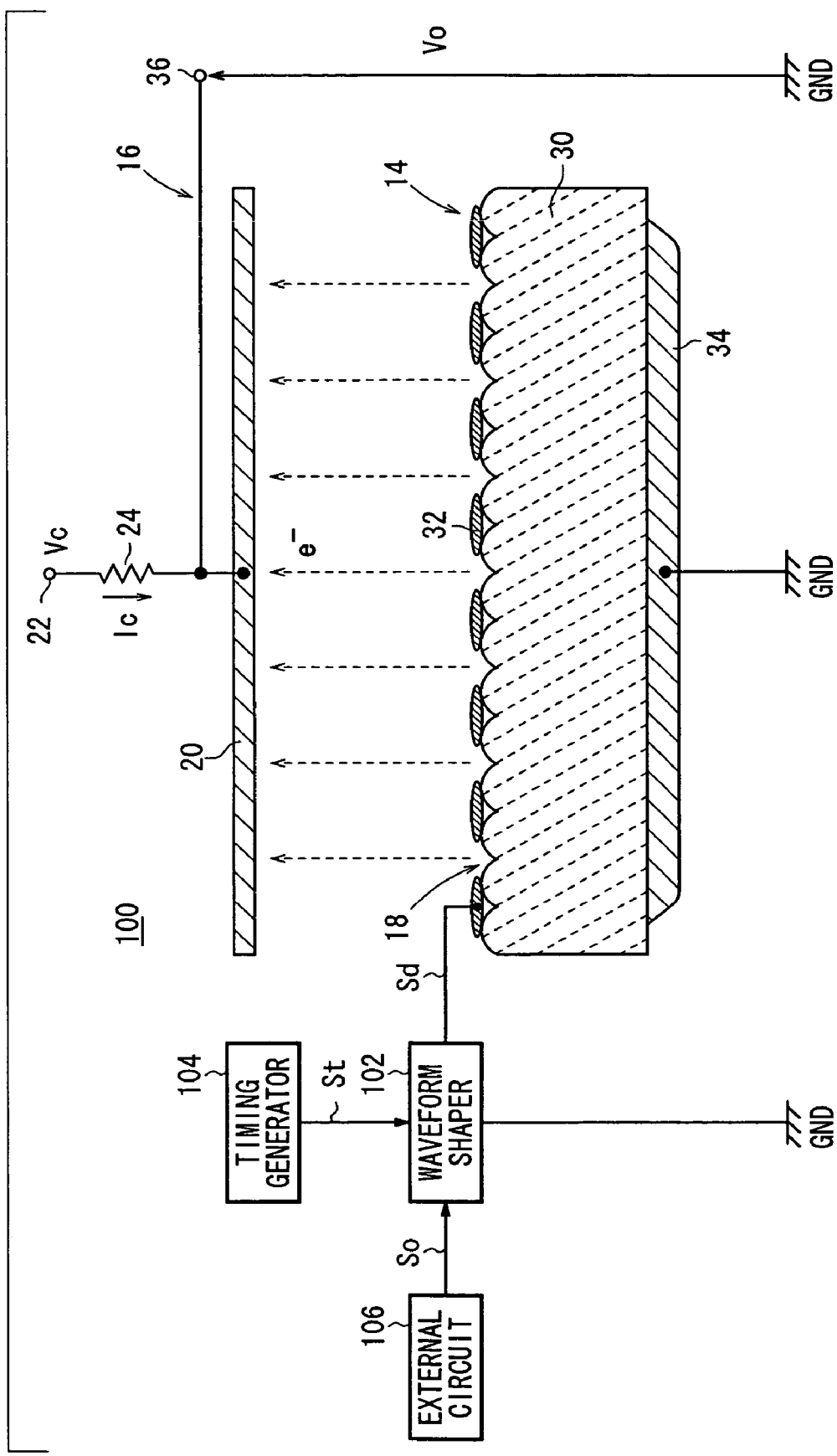
FIG. 16 is a schematic diagram of an amplifying circuit according to an embodiment of the present invention.

As shown in FIG. 16, a first application is concerned with an amplifying circuit 100 comprising a waveform shaper 102, a timing generator 104, an electron emitter 14, and an amplifier 16.

Figure 17:
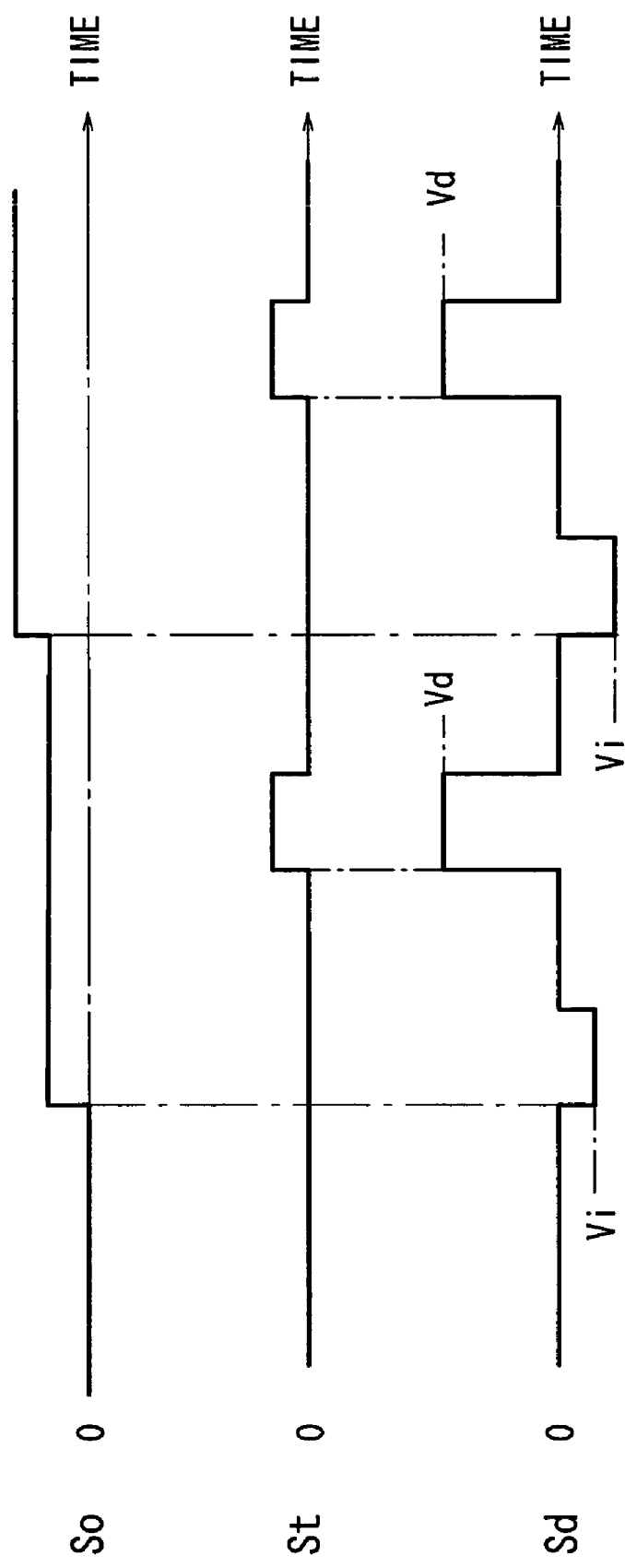
FIG. 17 is a timing chart of a signal processing process of a waveform shaper and a timing generator in the amplifying circuit according to the above embodiment.

As shown in FIG. 17, the waveform shaper 102 shapes a waveform of an output signal So from an external circuit 106 (see FIG. 16) connected to the waveform shaper 102 into a pulse waveform, producing an input voltage Vi, and adds a drive voltage Vd behind the input voltage Vi based on a trigger signal St supplied from the timing generator 104.

Stated otherwise, the waveform shaper 102 outputs a signal Sd having a waveform that is a series combination of the waveform of the input voltage Vi, which has a voltage level corresponding to a level (a current level, a voltage level, a frequency level, or the like) of the output signal So from the external circuit 106, and the waveform of the drive voltage Vd.

When the waveform of the input voltage Vi that is contained in the output signal Sd from the waveform shaper 102 is applied between the upper electrode 32 and the lower electrode 34 of the electron emitter 14, electric charges corresponding to the input voltage Vi are accumulated in the memory 18 of the electron emitter 14, as described above. When the waveform of the drive voltage Vd that is contained in the output signal Sd from the waveform shaper 102 is subsequently applied between the upper electrode 32 and the lower electrode 34 of the electron emitter 14, electrons corresponding to the electric charges accumulated in the memory 18 of the electron emitter 14 are emitted from the electron emitter 14. The electrons emitted from the electron emitter 14 are captured by the collector electrode 20 of the amplifier 16. At this time, a current (collector current Ic) flows between the collector electrode 20 and the electron emitter 14, developing a voltage drop across the load 24 connected to the collector electrode 20. The voltage drop is extracted as the output voltage Vo from the output terminal 36.

Specifically, if a voltage level (Vc) of the power supply 22 is 10 kV, then when the collector current Ic is zero, i.e., when the analog data is zero, the output voltage Vo is output as 10 kV. When the collector current Ic increases, i.e., when the analog data increases in level, within the range of Ic<Vc/R (R: resistance of the load 24), the output voltage Vo is output as Vo=Vc−IcR. When the collector current Ic reaches Ic=Vc/R, i.e., when the analog data reaches its maximum level, the output voltage Vo is output as Vo=0. Therefore, the output voltage Vo is expressed as Vo=Vc−kVi where k represents an amplification factor.

The amplifying circuit 100 holds (stores) the input voltage Vi as electric charges, and amplifies and outputs the input voltage Vi at a level in an output dynamic range that is about 1000 times as large as the input voltage Vi when the drive voltage Vd is subsequently applied. Since the atmosphere between the electron emitter 14 and the collector electrode 20 comprises a vacuum, the amplifying circuit 100 can respond to an input signal at a high speed. The amplifying circuit 100 can also be used as a delay amplifying circuit by selecting, as desired a time interval between the waveform of the input voltage Vi and the waveform of the drive voltage Vd.

Figure 18:
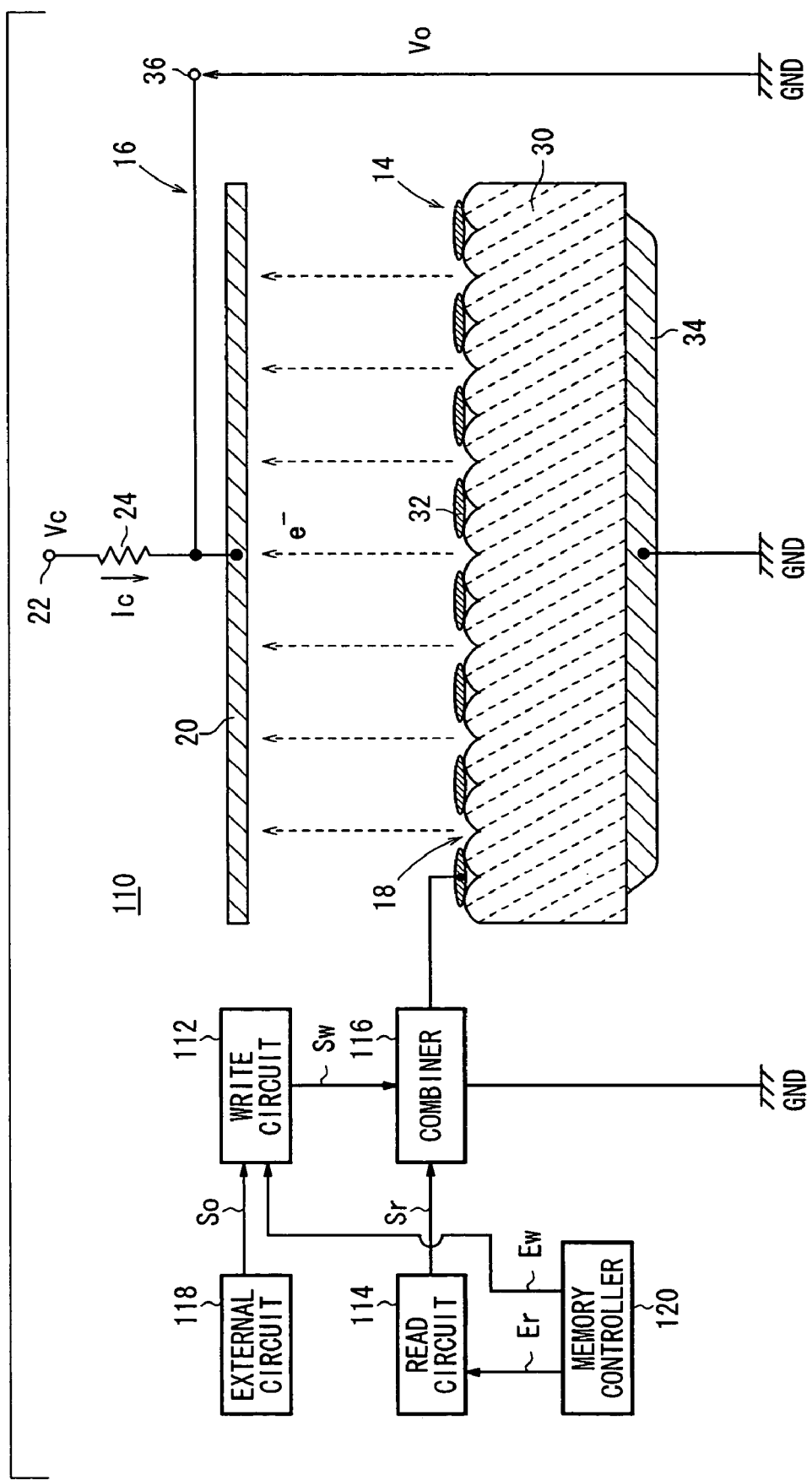
FIG. 18 is a schematic diagram of a memory device according to an embodiment of the present invention.

As shown in FIG. 18, a second application is concerned with a memory device 110 comprising a write circuit 112, a read circuit 114, a combiner 116, an electron emitter 14, and an amplifier 16.

Figure 19:
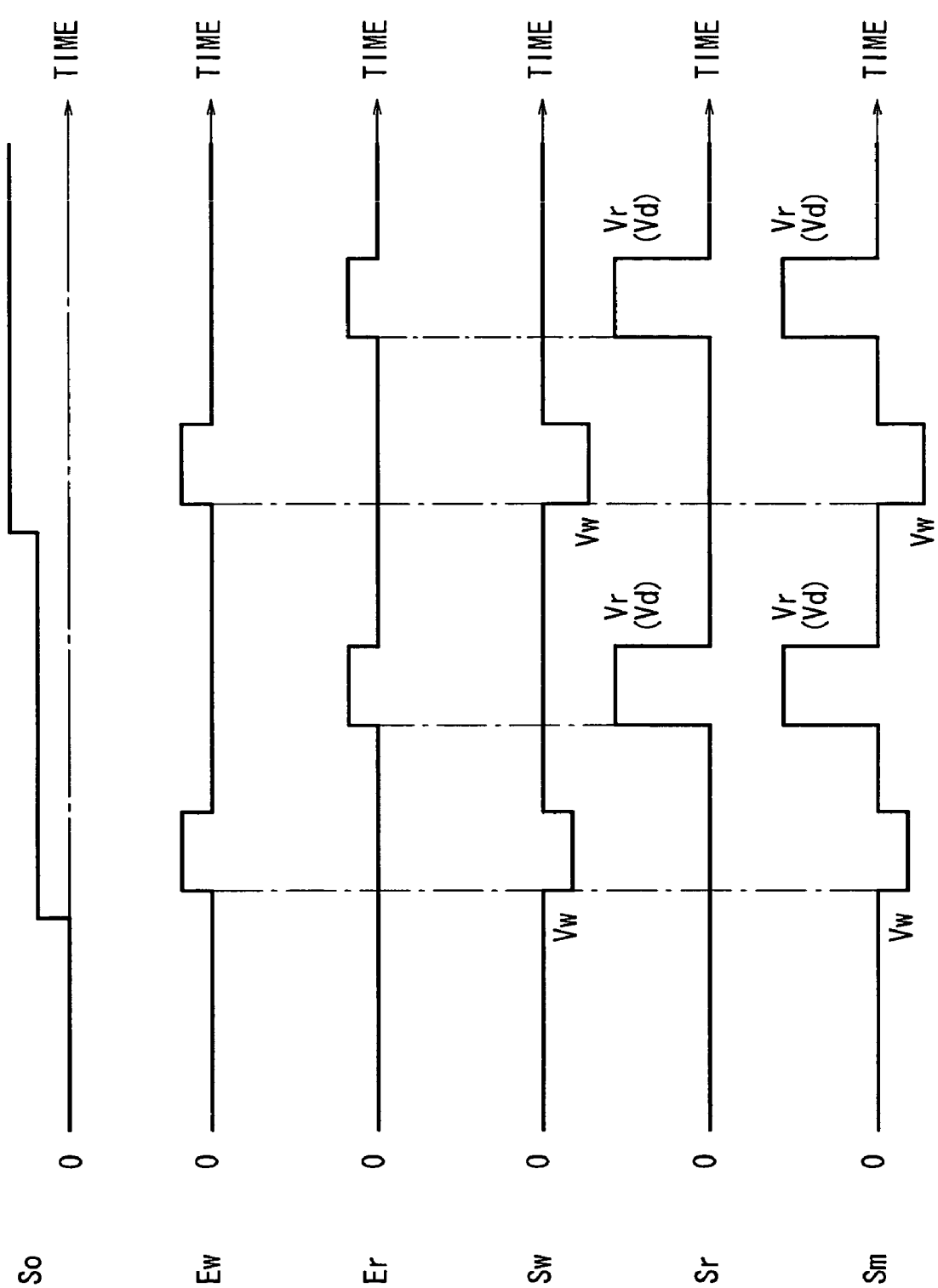
FIG. 19 is a timing chart of a signal processing process of a write circuit, a read circuit, and a signal combiner in the memory device according to the above embodiment.

As shown in FIG. 19, the write circuit 112 holds an output signal So from an external circuit 118 (see FIG. 18) connected to the write circuit 112, and shapes the waveform of the output signal So into a pulse waveform (write voltage Vw) based on an enable signal Ew from a memory controller 120 (see FIG. 18) and outputs the pulse waveform as a write signal Sw. The read circuit 114 outputs a read signal Sr having a read voltage Vr (drive voltage Vd) for a certain period of time based on an enable signal Er from the memory controller 120. The write signal Sw from the write circuit 112 and the read signal Sr from the read circuit 114 are supplied to the combiner 116. The combiner 116 combines the waveform of the write voltage Vw that is contained in the write signal Sw from the write circuit 112 and the waveform of the read voltage Vr (drive voltage Vd) that is contained in the read signal Sr from the read circuit 114, in series to each other, and outputs the combined waveforms as a combined signal Sm to the electron emitter 14. The read voltage Vr (drive voltage Vd) may comprise a pulse voltage having a certain amplitude.

When the write voltage Vw that is contained in the combined signal Sm from the combiner 116 is applied between the upper electrode 32 and the lower electrode 34 of the electron emitter 14, electric charges corresponding to the write voltage Vw are accumulated in the memory 18 of the electron emitter 14, as described above. When the read voltage Vr that is contained in the combined signal Sm from the combiner 116 is subsequently applied between the upper electrode 32 and the lower electrode 34 of the electron emitter 14, electrons corresponding to the electric charges accumulated in the memory 18 of the electron emitter 14 are emitted from the electron emitter 14. The electrons emitted from the electron emitter 14 are captured by the collector electrode 20 of the amplifier 16. At this time, a current (collector current Ic) flows between the collector electrode 20 and the electron emitter 14, developing a voltage drop across the load 24 connected to the collector electrode 20. The voltage drop is extracted as the output voltage Vo from the output terminal 36.

The memory device 110 is capable of storing the write voltage Vw not only in the form of binary digital data, but also in the form of an analog voltage corresponding to analog data. The memory device 110 can thus be used as a single memory device for storing analog data. Since the memory device 110 can be used as a single memory device directly for storing analog data, it offers the following advantages over ordinary memory devices.

Specifically, for storing analog data in an ordinary memory device and then outputting the stored analog data therefrom, the analog data is converted into 10-bit digital data (1024-level digital data), for example, by an A/D converter, and then the digital data is stored in the ordinary memory device. Then, the digital data stored in the ordinary memory device is read therefrom, and converted by a D/A converter back to analog data, which is output from the D/A converter.

On the other hand, the memory device 110 according to this embodiment, which can store analog data with a single memory device, is advantageous in that (1) the memory device 110 can be integrated at a scale which is at least ten times as high as the ordinary memory device which stores 10-bit digital data, for example, (2) the memory device 110 can store and output the analog data without accuracy reductions since it does not require the data to be converted by A/D and D/A converters, and (3) peripheral circuits of the memory device 110 can be reduced in cost and size since the memory device 110 does not need A/D and D/A converters.

Further, the memory device 110 can amplify and output the write voltage Vw at a level in an output dynamic range that is about 1000 times as large as the write voltage Vw applied to the electron emitter 14. Furthermore, the write voltage Vw can be read from the memory device 110 at a high speed. Accordingly, the memory device 110 can be used as a memory device in power electronics applications.

A number of memory devices 110 may be arrayed two-dimensionally for use as a memory array.

Figure 20:
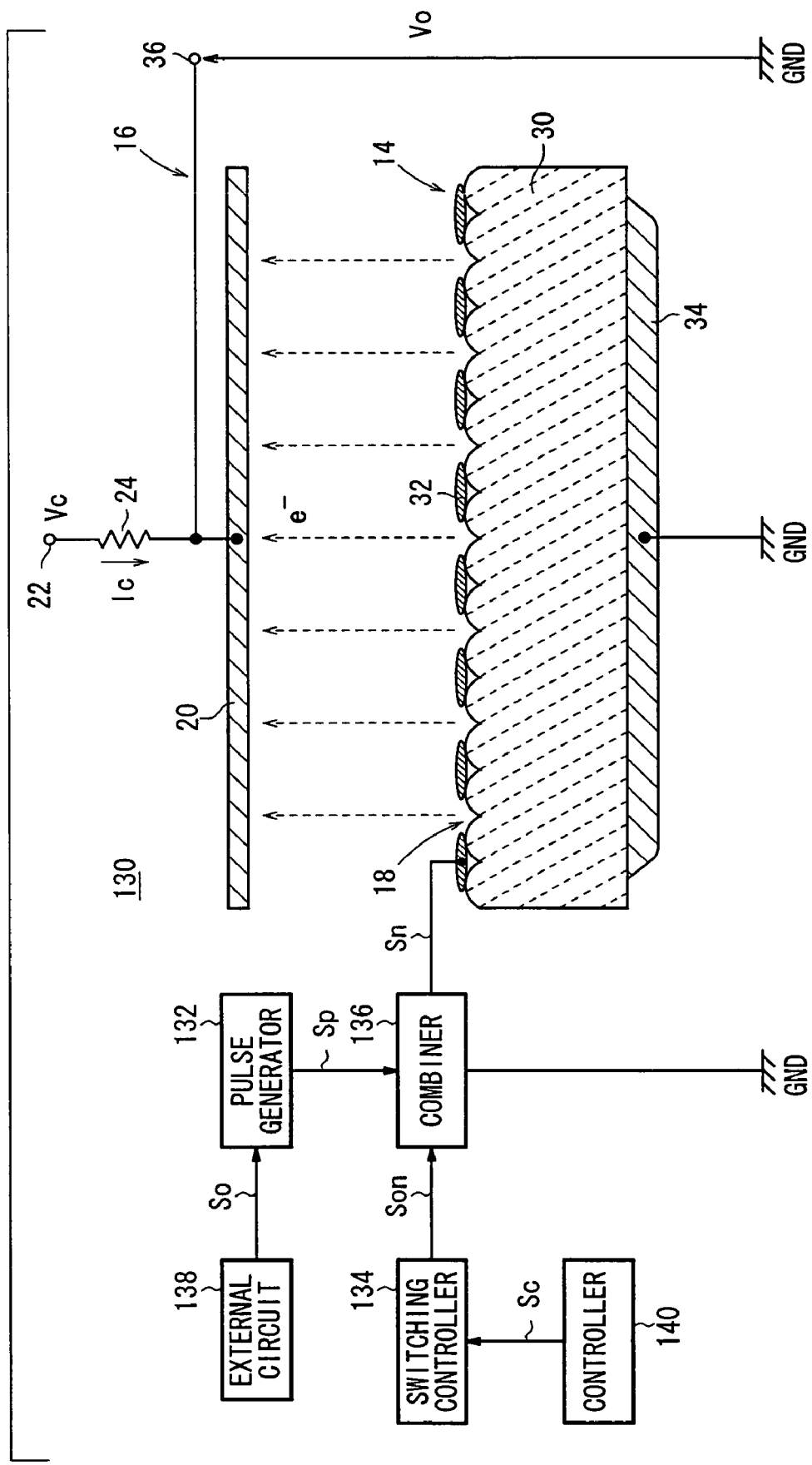
FIG. 20 is a schematic diagram of an analog switch according to an embodiment of the present invention.

As shown in FIG. 20, a third application is concerned with an analog switch 130 comprising a pulse generator 132, a switching controller 134, a combiner 136, an electron emitter 14, and an amplifier 16.

Figure 21:
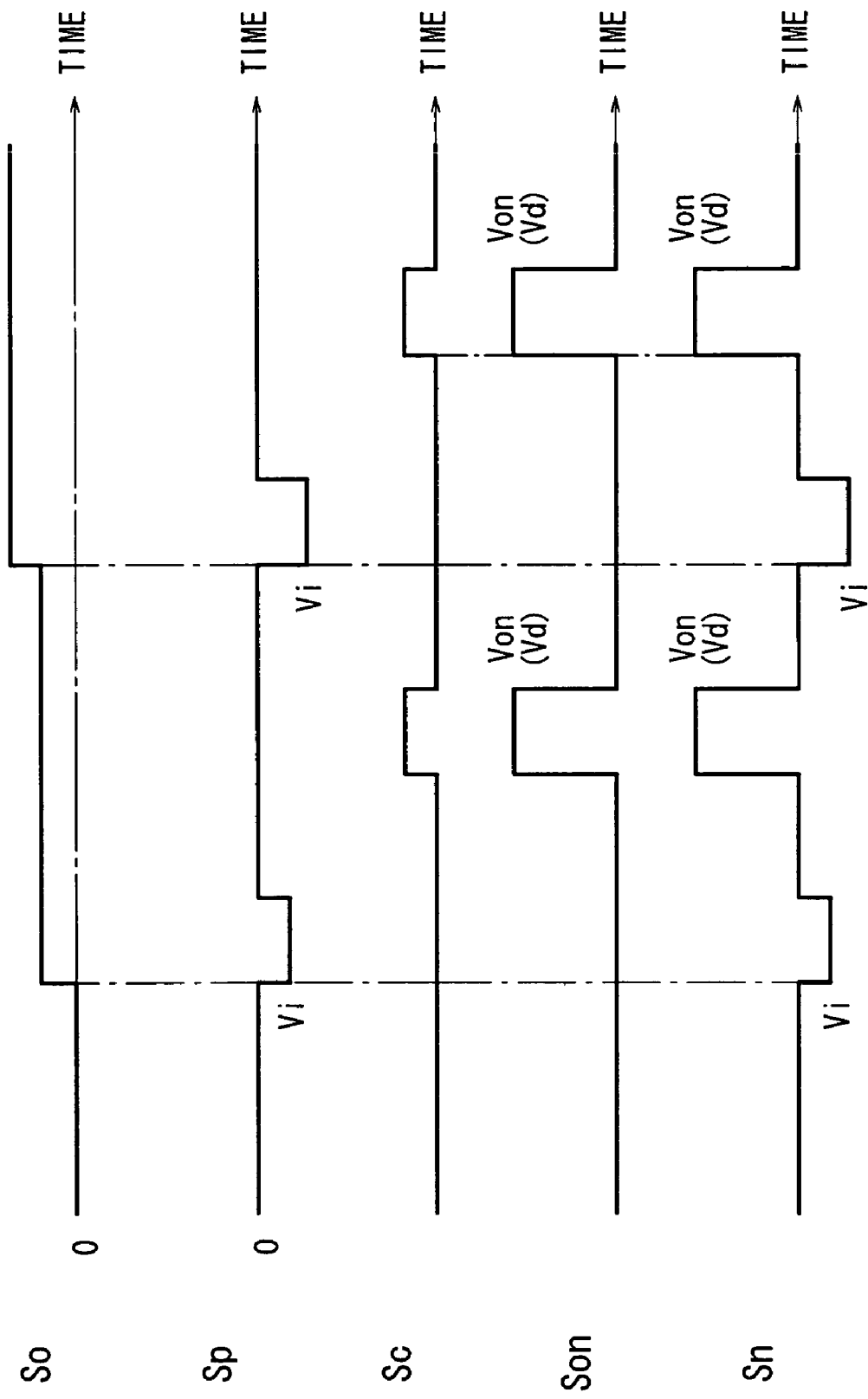
FIG. 21 is a timing chart of a signal processing process of a pulse generator, a switching controller, and a signal combiner in the analog switch according to the above embodiment.

As shown in FIG. 21, the pulse generator 132 shapes a waveform of an output signal So from an external circuit 138 (see FIG. 20) connected to the pulse generator 132 into a pulse waveform (input voltage Vi) and outputs the pulse waveform as a pulse signal Sp. The switching controller 134 outputs an on-signal Son having an on-control voltage Von (drive voltage Vd) for a certain period of time based on a on-control signal Sc from a controller 140 (see FIG. 20). The pulse signal Sp from the pulse generator 132 and the on-signal Son from the switching controller 134 are supplied to the combiner 136. The combiner 136 combines the waveform of the input voltage Vi that is contained in the pulse signal Sp from the pulse generator 132 and the waveform of the on-control voltage Von (drive voltage Vd) that is contained in the on-signal Son from the switching controller 134, in series to each other, and outputs the combined waveforms as a combined signal Sn to the electron emitter 14.

When the input voltage Vi that is contained in the combined signal Sn from the combiner 136 is applied between the upper electrode 32 and the lower electrode 34 of the electron emitter 14, electric charges corresponding to the input voltage Vi are accumulated in the memory 18 of the electron emitter 14, as described above. When the on-control voltage Von that is contained in the combined signal Sn from the combiner 136 is subsequently applied between the upper electrode 32 and the lower electrode 34 of the electron emitter 14, electrons corresponding to the electric charges accumulated in the memory 18 of the electron emitter 14 are emitted from the electron emitter 14. The electrons emitted from the electron emitter 14 are captured by the collector electrode 20 of the amplifier 16. At this time, a current (collector current Ic) flows between the collector electrode 20 and the electron emitter 14, developing a voltage drop across the load 24 connected to the collector electrode 20. The voltage drop is extracted as the output voltage Vo from the output terminal 36.

A direction and an amount of an output current from the analog switch 130 is controlled based on a direction and an amount of the collector current Ic that flows into the collector electrode 20 when the electrons are emitted from the electron emitter 14. Therefore, a diode is equivalently connected between the output terminal 36 and the memory 18 of the electron emitter 14, the diode having a cathode connected to the memory 18 and an anode connected to the output terminal 36. Consequently, the analog switch 130 functions as a current control unit.

The input voltage Vi may be a binary voltage for turning on and off the analog switch 130. However, if the input voltage Vi is an analog voltage, then the analog switch 130 can produce an analog voltage as the output voltage Vo corresponding to the input voltage Vi. The on-control voltage Von (drive voltage Vd) may preferably comprise a pulse voltage having a constant amplitude.

The analog switch 130 can provide an insulation capability for a high withstand voltage in the order of 10 kV when turned off and output the analog output voltage Vo corresponding to the input voltage Vi at a high speed when turned on.

A number of analog switches 130 may be arrayed two-dimensionally for use as an analog multiplexer.

Advantages of the electron emitter 14 which is incorporated in the microdevice 10, the amplifying circuit 100, the memory device 110, and the analog switch 130 will be described below with reference to FIG. 3.

Since the upper electrode 32 of the electron emitter 14 has the plural through regions 38, electrons are uniformly emitted from each of the through regions 38 and the outer peripheral portions of the upper electrode 32. Thus, any variations in the overall electron emission characteristics of the electron emitter 14 are reduced, making it possible to facilitate the control of the electron emission and increase electron emission efficiency.

Because the gap 46 is formed between each overhanging portion 44 of the upper electrode 32 and the emitter 30, when the drive voltage Vd is applied, an electric field concentration tends to be produced in the region of the gap 46. This leads to a higher efficiency of the electron emission, making the drive voltage lower (emitting electrons at a lower voltage level).

As described above, since the upper electrode 32 of the electron emitter 14 has the overhanging portion 44 on the peripheral portion of the through region 38, together with the increased electric field concentration in the region of the gap 46, electrons are easily emitted from the overhanging portion 44 of the upper electrode 32. This leads to a higher output and higher efficiency of the electron emission, making the drive voltage Vd lower. According to the above electron emission process, since the overhanging portion 44 of the upper electrode 32 functions as a gate electrode (a control electrode, a focusing electronic lens, or the like), straightness of emitted electrons can be improved. This is effective in reducing crosstalk between memory devices 110 if a number of memory devices 110 (see FIG. 18) each having the electron emitter 14 are arrayed for use as a memory array, for example, and also effective in reducing crosstalk between analog switches 130 if a number of analog switches 130 (see FIG. 20) each having the electron emitter 14 are arrayed for use as an analog multiplexer, for example.

As described above, the electron emitter 14 is capable of easily developing a high electric field concentration, provides many electron emission regions, has a higher output and higher efficiency of the electron emission, and can be driven at a lower voltage (lower power consumption).

In particular, at least the upper surface of the emitter 30 is uneven (the uneven surface 40) by the grain boundary of the dielectric material. Since the upper electrode 32 has the through regions 38 in portions corresponding to the notches 42 of the grain boundary of the dielectric material, the overhanging portions 44 of the upper electrode 32 can easily be realized.

The maximum angle θ between the upper surface of the emitter 30, i.e., the surface of the protuberance 48 (which is also the inner wall surface of the notch 42) of the grain boundary of the dielectric material, and the lower surface 44a of the overhanging portion 44 of the upper electrode 32 is in the range of $1° \leq θ \leq 60°$. The maximum distance d in the vertical direction between the surface of the protuberance 48 (the inner wall surface of the notch 42) of the grain boundary of the dielectric material and the lower surface 44a of the overhanging portion 44 of the upper electrode 32 is in the range of $0\ \mu m < d \leq 10\ \mu m$. These arrangements make it possible to increase the degree of the electric field concentration in the region of the gap 46, resulting in a higher output and higher efficiency of the electron emission and making the drive voltage lower efficiently.

As shown in FIG. 3, the portions of the emitter 30 where the polarization is inverted or changed corresponding to the drive voltage Vd applied between the upper electrode 32 and the lower electrode 34 (see FIG. 2) include a portion (first portion) 150 directly below the upper electrode 32 and a portion (second portion) 152 corresponding to a region extending from the inner peripheral edge of the through region 38 inwardly of the through region 38. Particularly, the second portion 152 changes corresponding to the level of the drive voltage Vd and the degree of the electric field concentration. In the electron emitter 14, each through region 38 is in the shape of the hole 50, and the average diameter of the hole 50 is in the range from 0.1 μm to 10 μm. Insofar as the average diameter of the hole 50 is in this range, the distribution of electrons emitted through the through regions 38 is almost free of any variations, allowing the electrons to be emitted efficiently.

If the average diameter of the hole 50 is less than 0.1 μm, then the region where electrons are accumulated is made narrower, reducing the amount of emitted electrons. While one solution would be to form many holes 50, it would be difficult and highly costly to form many holes 50. If the average diameter of the hole 50 is in excess of 10 μm, then the proportion (share) of the portion (second portion) 152 which contributes to the emission of electrons in the portion of the emitter 30 that is exposed through the through region 38 is reduced, resulting in a reduction in the electron emission efficiency.

Figure 22:
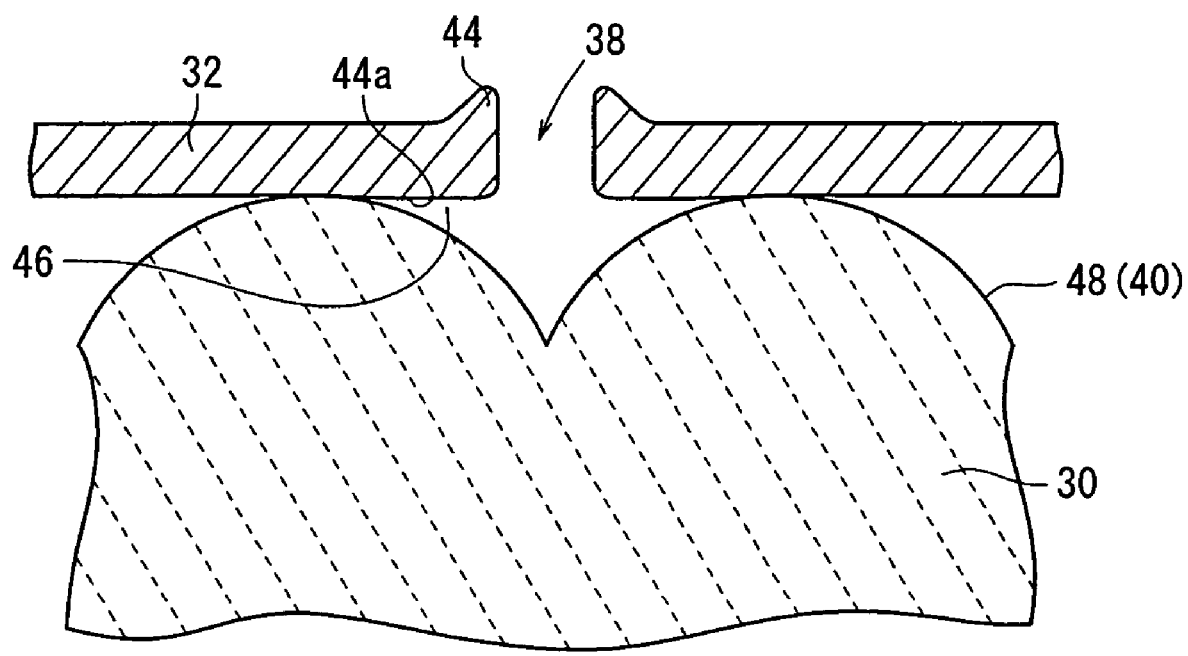
FIG. 22 is a view showing a cross-sectional shape of an overhanging portion of the upper electrode.
Figure 23:
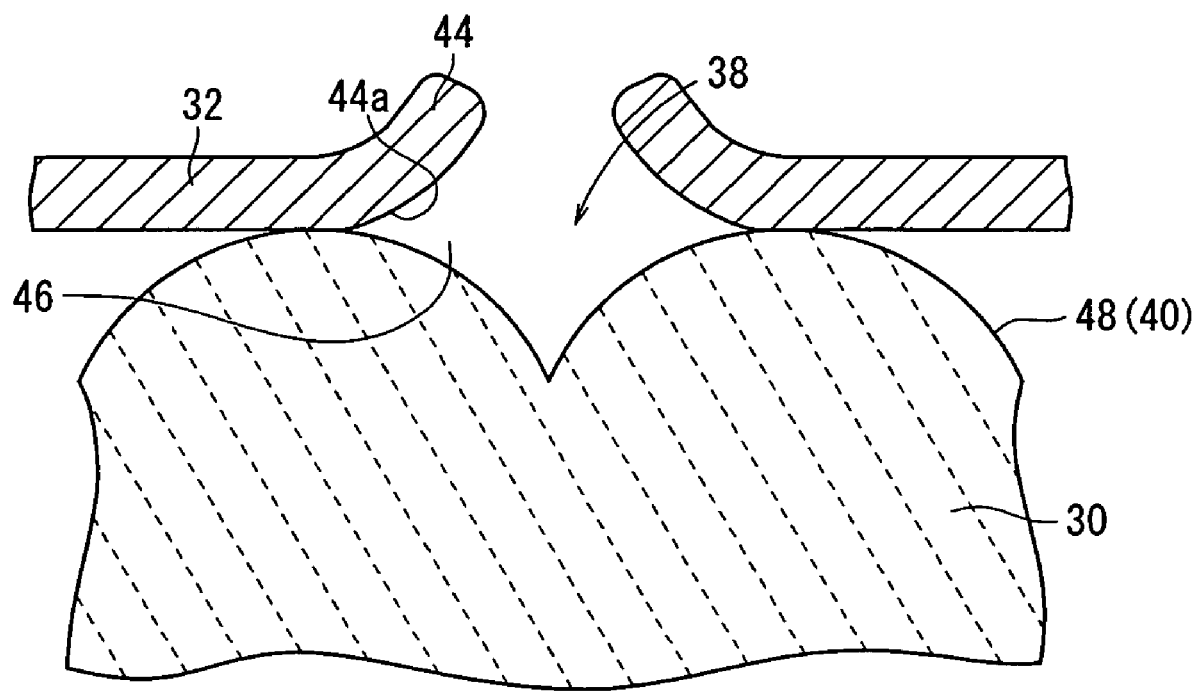
FIG. 23 is a view showing a cross-sectional shape of another overhanging portion of the upper electrode.
Figure 24:
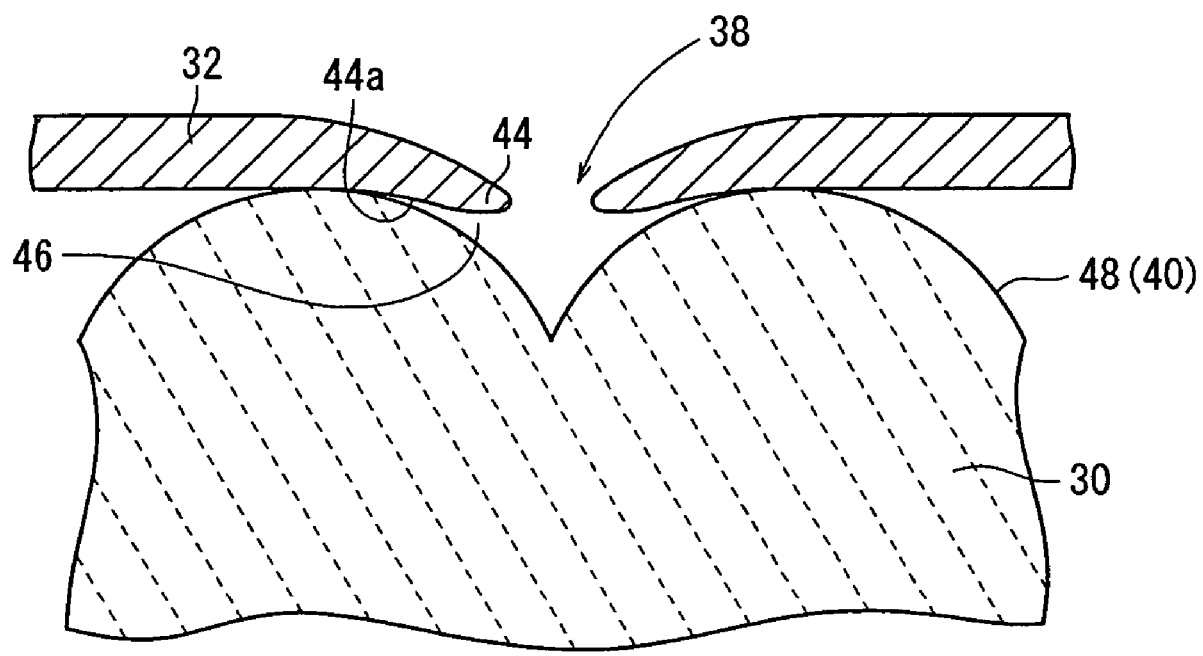
FIG. 24 is a view showing a cross-sectional shape of still another overhanging portion of the upper electrode.

The overhanging portion 44 of the upper electrode 32 may have upper and lower surfaces extending horizontally as shown in FIG. 3. Alternatively, as shown in FIG. 22, the overhanging portion 44 may have a lower surface 44a extending substantially horizontally and an upper end raised upwardly. Alternatively, as shown in FIG. 23, the overhanging portion 44 may have a lower surface 44a inclined progressively upwardly toward the center of the through region 38. Further alternatively, as shown in FIG. 24, the overhanging portion 44 may have a lower surface 44a inclined progressively downwardly toward the center of the through region 38. The arrangement shown in FIG. 22 is capable of increasing the function as a gate electrode. The arrangement shown in FIG. 24 makes it easier to produce a higher electric field concentration for a higher output and higher efficiency of the electron emission since the gap 46 is narrower.

Modifications of the above-described electron emitter 14 will be described below with reference to FIGS. 25 through 33.

Figure 25:
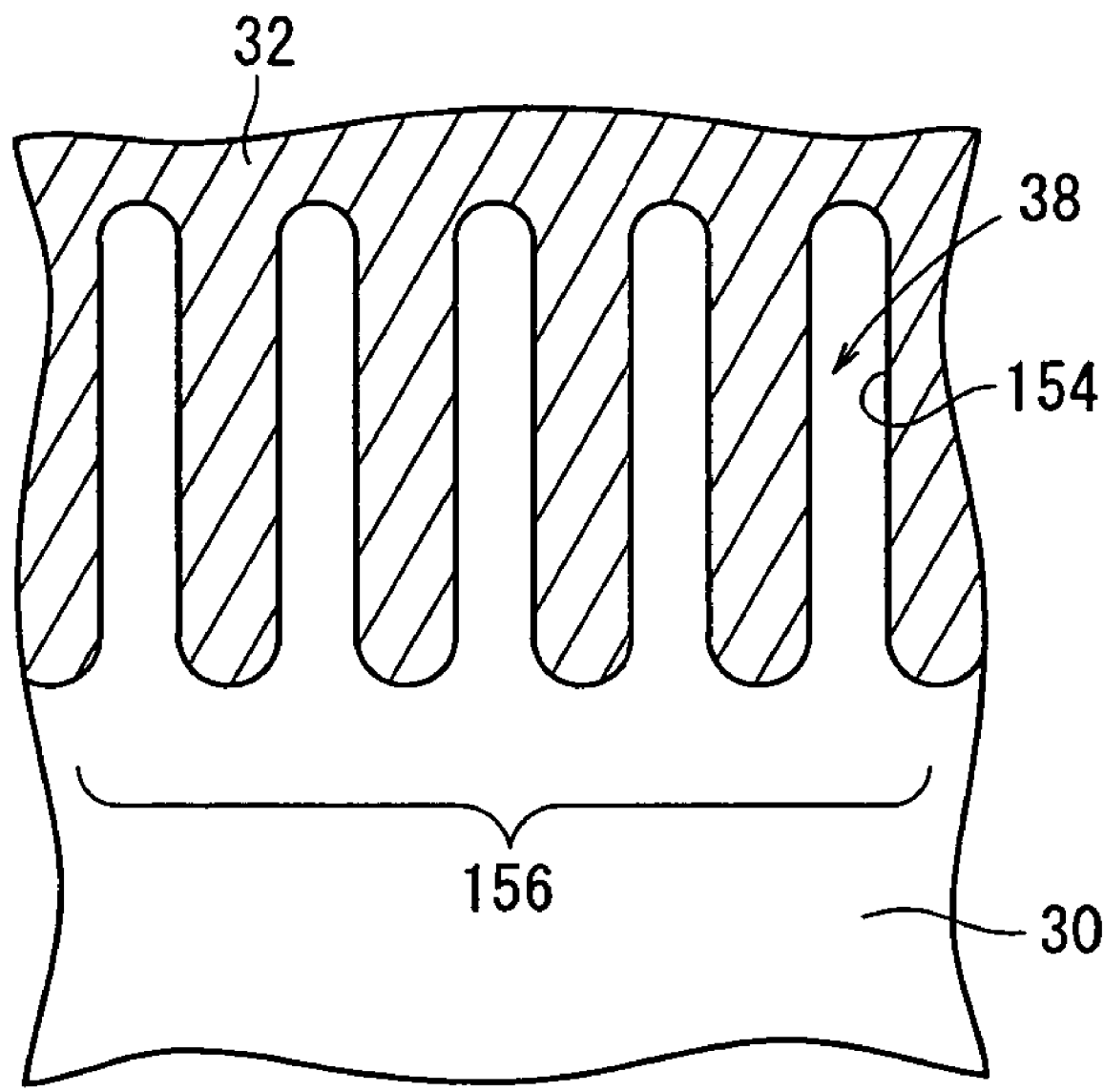
FIG. 25 is a fragmentary plan view of an electron emitter according to a first modification.

As shown in FIG. 25, an electron emitter 14a according to a first modification differs from the above electron emitter 14 in that the through region 38 has a shape, particularly a shape viewed from above, in the form of a notch 154. As shown in FIG. 25, the notch 154 may preferably be shaped such that a number of notches 154 are successively formed into a saw-toothed notch 156. The saw-toothed notch 156 is effective to reduce variations in the distribution of electrons emitted through the through regions 38 for efficient electron emission. Particularly, it is preferable to have an average width of the notches 154 in the range from 0.1 μm to 10 μm. The average width represents an average of lengths of a plurality of different line segments extending perpendicularly across the central line of the notch 154.

Figure 26:
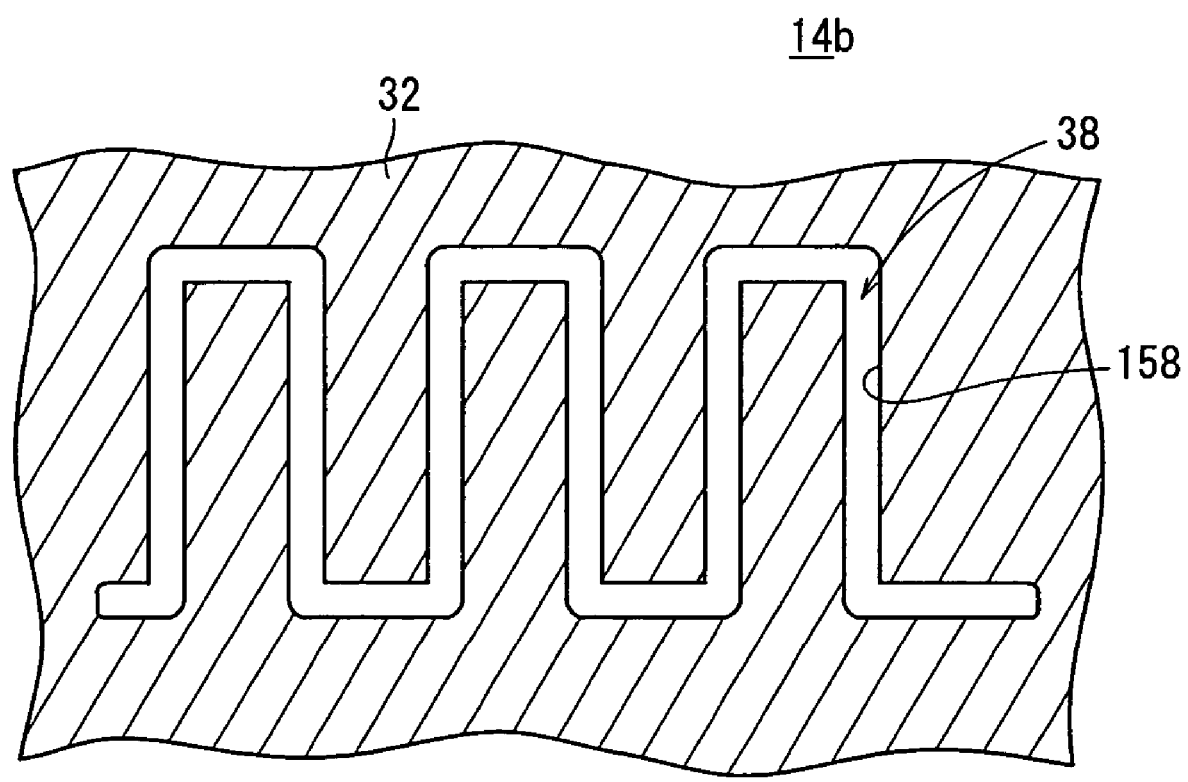
FIG. 26 is a fragmentary plan view of an electron emitter according to a second modification.

As shown in FIG. 26, an electron emitter 14b according to a second modification differs from the above electron emitter 14 in that the through region 38 has a shape, particularly a shape viewed from above, in the form of a slit 158. The slit 158 is defined as something having a major axis (extending in a longitudinal direction) whose length is 10 times or more the length of the minor axis (extending in a transverse direction) thereof. Those having a major axis (extending in a longitudinal direction) whose length is less than 10 times the length of the minor axis (extending in a transverse direction) thereof are defined as holes 50 (see FIG. 4). The slit 158 includes a succession of holes 50 in communication with each other. The slit 158 may preferably have an average width ranging from 0.1 μm to 10 μm for reducing variations in the distribution of electrons emitted through the through region 38 for efficient electron emission. The average width represents an average of lengths of a plurality of different line segments extending perpendicularly across the central line of the slit 158.

Figure 27:
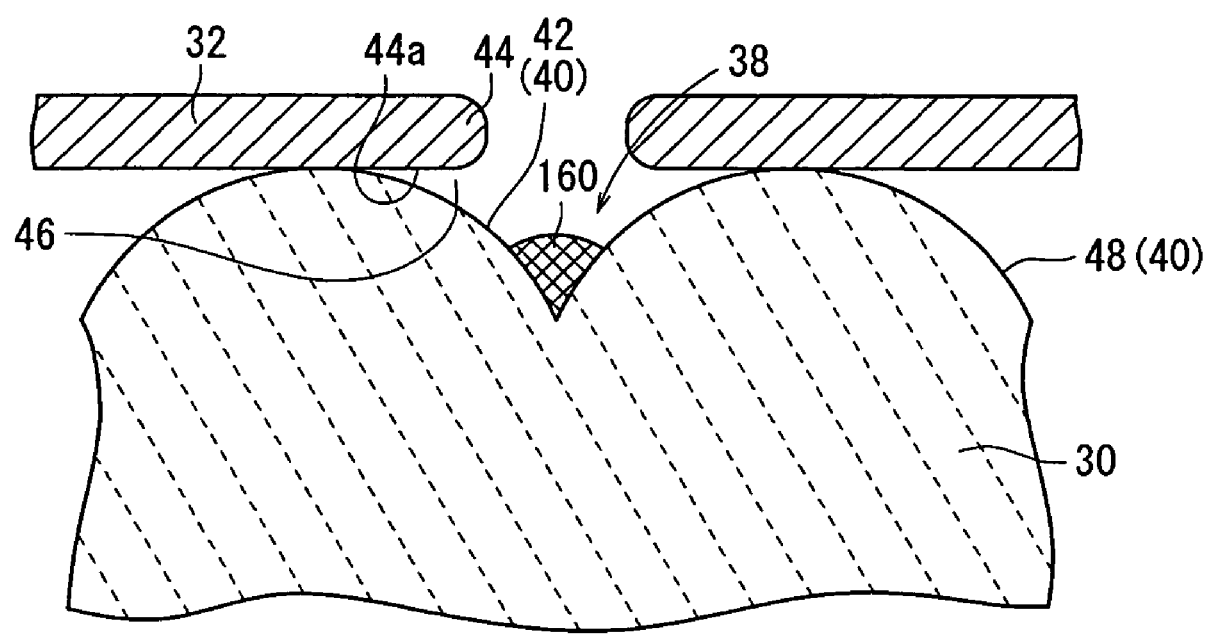
FIG. 27 is a fragmentary cross-sectional view of an electron emitter according to a third modification.

As shown in FIG. 27, an electron emitter 14c according to a third modification differs from the above electron emitter 14 in that a floating electrode 160 exists on a portion of the upper surface of the emitter 30 which corresponds to the through region 38, e.g., in the notch 42 of the grain boundary of the dielectric material. With this arrangement, since the floating electrode 160 functions as an electron supply source, the electron emitter 14c can emit many electrons through the through region 38 in an electron emission stage (second stage). The electron emission from the floating electrode 160 may be attributed to an electric field concentration at the triple junction of the floating electrode 160, the dielectric material, and the vacuum.

Figure 28:
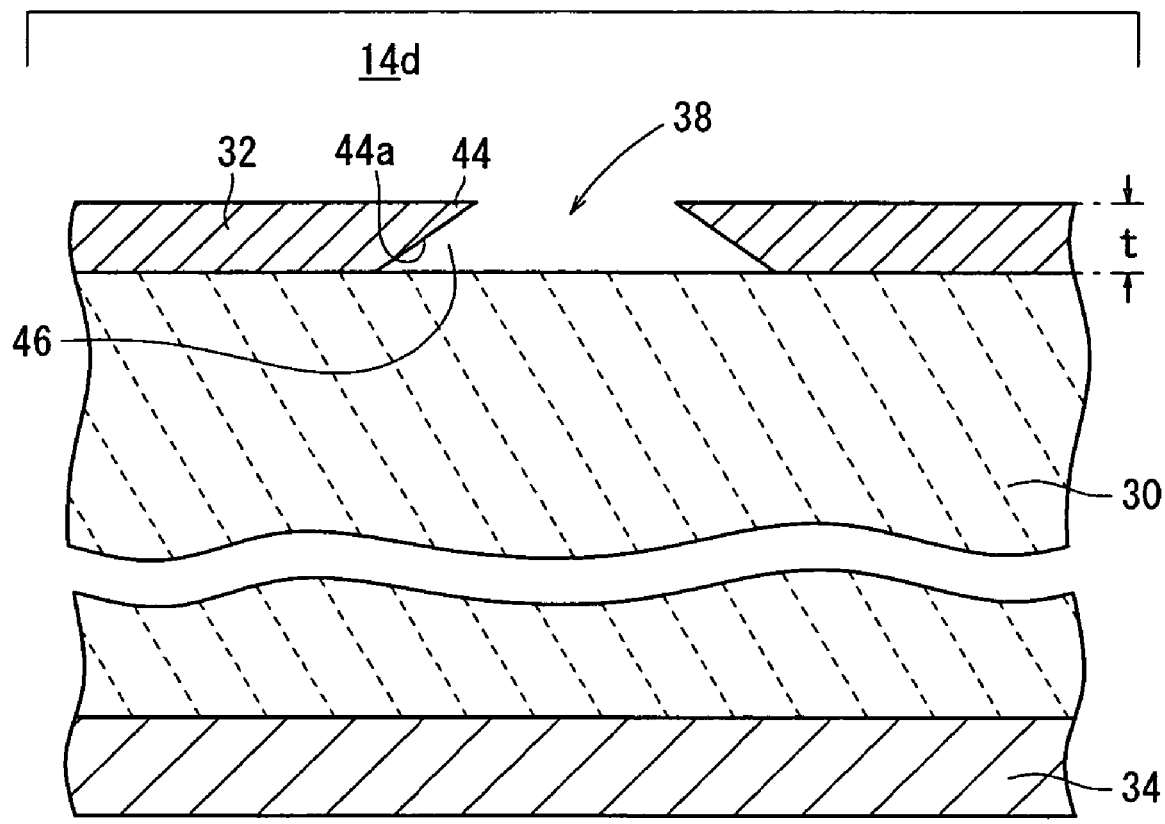
FIG. 28 is a fragmentary cross-sectional view of an electron emitter according to a fourth modification.

As shown in FIG. 28, an electron emitter 14d according to a fourth modification resides in that the upper electrode 32 is made of the same material as the lower electrode 34, the upper electrode 32 has a thickness t greater than 10 μm, and the through region 38 is artificially formed by etching (wet etching or dry etching), lift-off, or a laser beam. The through region 38 may be shaped as the hole 50, the notch 154, or the slit 158, as with the electron emitters 14, 14a, 14b described above.

Figure 29:
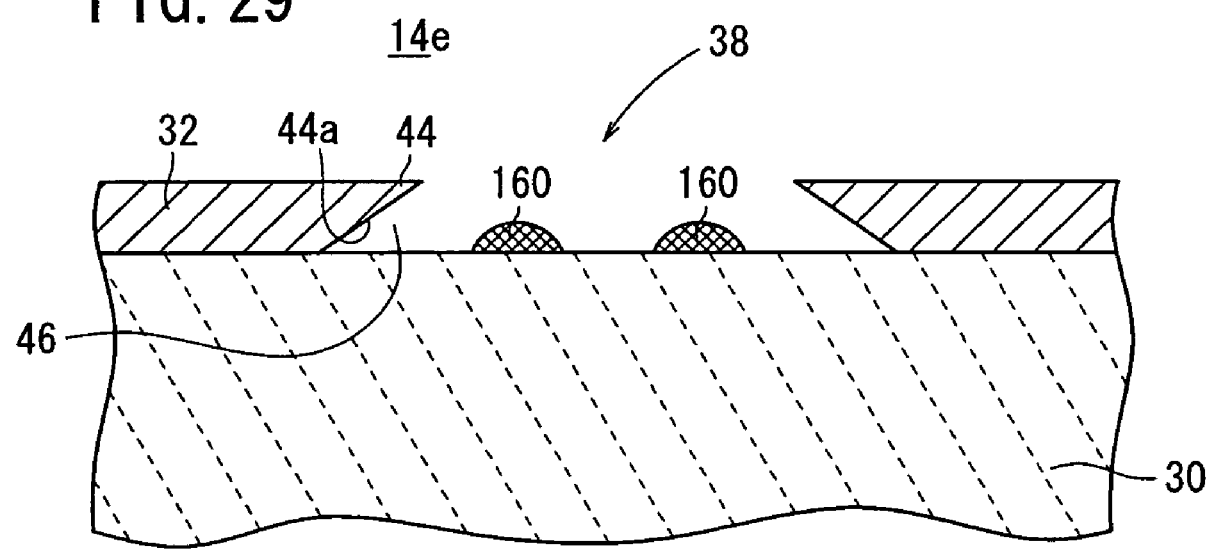
FIG. 29 is a fragmentary cross-sectional view of an electron emitter according to a fifth modification.

FIG. 29 shows an electron emitter 14e according to a fifth modification. The electron emitter 14e has floating electrodes 160 which are present on a portion of the upper surface of the emitter 30 which corresponds to the through region 38.

FIG. 30 shows an electron emitter 14f according to a sixth modification. The electron emitter 14f has upper electrodes 32 each having a substantially T-shaped cross section.

FIG. 31 shows an electron emitter 14g according to a seventh modification. The electron emitter 14g has an upper electrode 32 including a lifted peripheral portion 44 of a through region 38. To produce such a shape, film material of the upper electrode 32 contains a material which will be gasified in the firing process. Accordingly, in the firing process, the material is gasified, forming a number of through regions 38 in the upper electrode 32 and lifting the peripheral portions 44 of the through regions 38.

As shown in FIG. 32, an electron emitter 14h according to an eighth embodiment has a single substrate 162 of ceramics, a lower electrode 34 formed on the substrate 162, an emitter 30 formed on the substrate 162 in covering relation to the lower electrode 34, and an upper electrode 32 formed on the emitter 30.

The substrate 162 has a cavity 164 defined therein at a position aligned with the emitter 30 to form a thinned portion to be described below. The cavity 164 communicates with the exterior through a through hole 166 having a small diameter which is defined in the other end of the substrate 162 remote from the emitter 30.

A portion of the substrate 162 below which the cavity 164 is defined is thinned (hereinafter referred to as "thinned portion 168"). The other portion of the substrate 162 is thicker and functions as a stationary block 170 for supporting the thinned portion 168.

Specifically, the substrate 162 comprises a laminated assembly of a substrate layer 162A as a lowermost layer, a spacer layer 162B as an intermediate layer, and a thin layer 162C as an uppermost layer. The laminated assembly may be regarded as an integral structure with the cavity 164 defined in a portion of the spacer layer 162B which is aligned with the emitter 30. The substrate layer 162A functions as a stiffening substrate and also as a wiring substrate. The substrate 162 may be formed by simultaneously firing the substrate layer 162A, the spacer layer 162B, and the thin layer 162C, or may be formed by bonding the substrate layer 162A, the spacer layer 162B, and the thin layer 162C together.

The thinned portion 168 may preferably be made of a highly heat-resistant material. The reason for this is that if the thinned portion 168 is directly supported by the stationary block 170 without using a less heat-resistant material such as an organic adhesive or the like, the thinned portion 168 is not be modified at least when the emitter 30 is formed.

The thinned portion 168 may preferably be made of an electrically insulating material in order to electrically isolate the interconnects connected to the upper electrode 32 formed on the substrate 162 and the interconnects connected to the lower electrode 34 formed on the substrate 162.

The thinned portion 168 may thus be made of a material such as a highly heat-resistant metal and an enameled material where a surface of the highly heat-resistant metal is covered with a ceramic material such as glass. However, ceramics is optimum as the material of the thinned portion 168.

The ceramics of the thinned portion 168 may also be stabilized zirconium oxide, aluminum oxide, magnesium oxide, titanium oxide, spinel, mullite, aluminum nitride, silicon nitride, glass, or a mixture thereof. Of these materials, aluminum oxide and stabilized zirconium oxide are particularly preferable since they provide high mechanical strength and high rigidity. Stabilized zirconium oxide is particularly suitable since it has relatively high mechanical strength, relatively high tenacity, and causes a relatively small chemical reaction with the upper electrode 32 and the lower electrode 34. Stabilized zirconium oxide includes both stabilized zirconium oxide and partially stabilized zirconium oxide. Stabilized zirconium oxide does not cause a phase transition since it has a crystalline structure such as a cubic structure or the like.

On the other hand, zirconium oxide causes a phase transition between a monoclinic structure and a tetragonal structure at about 1000° C., and may crack upon such a phase transition. Stabilized zirconium oxide contains 1 to 30 mol % of a stabilizer such as calcium oxide, magnesium oxide, yttrium oxide, scandium oxide, ytterbium oxide, cerium oxide, or an oxide of a rare earth metal. The stabilizer may preferably contain yttrium oxide for increasing the mechanical strength of the substrate 162. The stabilizer may preferably contain 1.5 to 6 mol % of yttrium oxide, or more preferably 2 to 4 mol % of yttrium oxide, and furthermore may preferably contain 0.1 to 5 mol % of aluminum oxide.

The crystalline phase of stabilized zirconium oxide may be a mixture of cubic and monoclinic systems, a mixture of tetragonal and monoclinic systems, or a mixture of cubic, tetragonal and monoclinic systems. Main crystalline phase may most preferably be a monoclinic system or a mixture of tetragonal and monoclinic systems from the standpoint of strength, tenacity, and durability.

If the substrate 162 is made of ceramics, then it is constructed of relatively many crystal grains. In order to increase the mechanical strength of the substrate 162, the average diameter of the crystal grains may preferably be in the range from 0.05 to 2 μm and more preferably in the range from 0.1 to 1 μm.

The stationary block 170 may preferably be made of ceramics. The stationary block 170 may be made of ceramics which is the same as or different from the ceramics of the thinned portion 168. As with the material of the thinned portion 168, the ceramics of the stationary block 170 may be stabilized zirconium oxide, aluminum oxide, magnesium oxide, titanium oxide, spinel, mullite, aluminum nitride, silicon nitride, glass, or a mixture thereof.

The substrate 162 used in the electron emitter 14h is made of a material containing zirconium oxide as a main component, a material containing aluminum oxide as a main component, or a material containing a mixture of zirconium oxide and aluminum oxide as a main component. Particularly preferable is a material mainly containing zirconium oxide.

Clay or the like may be added as a sintering additive. Components of such a sintering additive need to be adjusted so that the sintering additive does not contain excessive amounts of materials which can easily be vitrified, e.g., silicon oxide, boron oxide, etc. This is because while these easily vitrifiable materials are advantageous in joining the substrate 162 to the emitter 30, they promote a reaction between the substrate 162 and the emitter 30, making it difficult to keep the desired composition of the emitter 30 and resulting in a reduction in the device characteristics.

Specifically, the easily vitrifiable materials such as silicon oxide in the substrate 162 may preferably be limited to 3% by weight or less or more preferably to 1% by weight or less. The main component referred to above is a component which occurs at 50% by weight or more.

The thickness of the thinned portion 168 and the thickness of the emitter 30 may preferably be of substantially the same level. If the thickness of the thinned portion 168 were extremely larger than the thickness of the emitter 30 by at least ten times, then since the thinned portion 168 would work to prevent the emitter 30 from shrinking when it is fired, large stresses would be developed in the interface between the emitter 30 and the substrate 162, making the emitter 30 easy to peel off the substrate 162. If the thickness of the thinned portion 168 is substantially the same as the thickness of the emitter 30, the substrate 162 (the thinned portion 168) is easy to follow the emitter 30 as it shrinks when it is fired, allowing the substrate 162 and the emitter 30 to be appropriately combined with each other. Specifically, the thickness of the thinned portion 168 may preferably be in the range from 1 to 100 μm, more particularly in the range from 3 to 50 μm, and even more particularly in the range from 5 to 20 μm. The thickness of the emitter 30 may preferably be in the range from 5 to 100 μm, more particularly in the range from 5 to 50 μm, and even more particularly in the range from 5 to 30 μm.

The emitter 30 may be formed on the substrate 162 by any of various thick-film forming processes including screen printing, dipping, coating, electrophoresis, aerosol deposition, etc., or any of various thin-film forming processes including an ion beam process, sputtering, vacuum evaporation, ion plating, chemical vapor deposition (CVD), plating, etc. Particularly, it is preferable to form the emitter 30 by impregnating a powdery piezoelectric/electrostrictive material with glass of a low melting point or sol particles. According to this process, it is possible to form a film at a low temperature of 700° C. or lower or 600° C. or lower.

The material of the lower electrode 34, the material of the emitter 30, and the material of the upper electrode 32 may be successively stacked on the substrate 162, and then fired into an integral structure as the electron emitter 14h. Alternatively, each time the lower electrode 34, the emitter 30, or the upper electrode 32 is formed, the assembly may be heated (sintered) into an integral structure. Depending on how the upper electrode 32 and the lower electrode 34 are formed, however, the heating (sintering) process for producing an integral structure may not be required.

The sintering process for integrally combining the substrate 162, the emitter 30, the upper electrode 32, and the lower electrode 34 may be carried out at a temperature ranging from 500° to 1400° C., preferably from 1000° to 1400° C. For heating the emitter 30 which is in the form of a film, the emitter 30 may preferably be sintered together with its evaporation source while their atmosphere is being controlled, so that the composition of the emitter 30 will not become unstable at high temperatures.

The emitter 30 may be covered with a suitable member, and then sintered such that the surface of the emitter 30 will not be exposed directly to the sintering atmosphere. In this case, the covering member may preferably be of the same material as the substrate 162.

With the electron emitter 14h according to the eighth modification, the emitter 30 shrinks when fired. However, since stresses produced when the emitter 30 shrinks are released when the cavity 164 is deformed, the emitter 30 can sufficiently be densified. The densification of the emitter 30 increases the withstand voltage and allows the emitter 30 to carry out the polarization inversion and the polarization change efficiently in the emitter 30, resulting in improved characteristics of the electron emitter 14h.

FIG. 33 shows an electron emitter 14i according to a ninth modification which has a two-layer substrate 162a which is free of the lowermost substrate layer 162A.

Although certain preferred embodiments of the present invention have been shown and described in detail, it should be understood that various changes and modifications may be made therein without departing from the scope of the appended claims.

What is claimed is:

1. A microdevice comprising:
an electron emitter including a memory for accumulating electric charges corresponding to an input voltage, for emitting electrons corresponding to the electric charges accumulated in said memory; and
an amplifier connected to a power supply and including a collector electrode for capturing the electrons emitted from said electron emitter;
wherein an atmosphere between at least said electron emitter and the collector electrode is a vacuum,
wherein said input voltage is applied to said electron emitter in a first period to accumulate electric charges corresponding to a level of said input voltage in said electron emitter;
wherein a voltage necessary to emit electrons is applied to said electron emitter in a second period to emit electrons corresponding to the accumulated electric charges from said electron emitter; and wherein said amplifier outputs a voltage corresponding to a collector current that flows in said collector electrode when said electrons are emitted from the electron emitter.

2. A microdevice according to claim 1, further comprising:
a load connected between said collector electrode and said power supply;
wherein said microdevice outputs a voltage generated across said load by said collector current.

3. A microdevice according to claim 1, wherein said electron emitter has an emitter made of a dielectric material and a first electrode and a second electrode between which a voltage is applicable;
said first electrode being disposed on a first surface of said emitter;
said second electrode being disposed on a second surface of said emitter; and
at least said first electrode having a plurality of through regions through which said emitter is exposed, each of said through regions of said first electrode including a peripheral portion having a surface facing said emitter, said surface being spaced from said emitter.

4. A microdevice according to claim 3, wherein at least said first surface of said emitter is an uneven surface based on the grain boundary of said dielectric material,
said through regions of said first electrode being formed in areas corresponding to notches of the grain boundary of said dielectric material.

5. A microdevice according to claim 3, wherein said first electrode comprises a cluster of a plurality of scale-like members or a cluster of electrically conductive members including scale-like members.

6. A microdevice according to claim 1, wherein said electron emitter has:
an emitter made of a dielectric material;
a first electrode disposed in contact with a first surface of said emitter; and
a second electrode disposed in contact with a second surface of said emitter;
at least said first electrode having a plurality of through regions through which said emitter is exposed;
said electron emitter having in its electrical operation, between said first electrode and said second electrode:
a capacitor formed from said emitter; and
a cluster of capacitors provided between said first electrode and said emitter by said through regions of said first electrode.

7. A microdevice according to claim 6, wherein at least said first surface of said emitter is an uneven surface based on the grain boundary of said dielectric material,
said through regions of said first electrode being formed in areas corresponding to notches of the grain boundary of said dielectric material.

8. A microdevice according to claim 6, wherein said first electrode comprises a cluster of a plurality of scale-like members or a cluster of electrically conductive members including scale-like members.

9. A microdevice array comprising:
a first substrate having thereon a two-dimensional array of microdevices each according to claim 1, and interconnects interconnecting said microdevices and interconnects interconnecting said microdevices and input/output terminals;
a second substrate having individual collector electrodes positioned in facing relation to the respective microdevices disposed on said first substrate, and interconnects interconnecting said collector electrodes and interconnects interconnecting said collector electrodes and input/output terminals.

10. An amplifying circuit comprising:
an electron emitter including a memory for accumulating electric charges corresponding to an input voltage, for emitting electrons corresponding to the electric charges accumulated in said memory; and
an amplifier connected to a power supply and including a collector electrode for capturing the electrons emitted from said electron emitter;
wherein an atmosphere between at least said electron emitter and the collector electrode is a vacuum,
wherein said input voltage is applied to said electron emitter in a first period to accumulate electric charges corresponding to a level of said input voltage in said electron emitter;
wherein a voltage necessary to emit electrons is applied to said electron emitter in a second period to emit electrons corresponding to the accumulated electric charges from said electron emitter; and
wherein said amplifier outputs a voltage corresponding to a collector current that flows in said collector electrode when said electrons are emitted from the electron emitter.

11. A memory device comprising:
an electron emitter including a memory for accumulating electric charges corresponding to a write voltage, for emitting electrons corresponding to the electric charges accumulated in said memory; and
an amplifier connected to a power supply and including a collector electrode for capturing the electrons emitted from said electron emitter;
wherein an atmosphere between at least said electron emitter and said collector electrode is a vacuum,
wherein said write voltage is applied to said electron emitter in a write period to accumulate electric charges corresponding to a level of said write voltage in said electron emitter;
wherein a read voltage necessary to emit electrons is applied to said electron emitter in a read period to emit electrons corresponding to the accumulated electric charges from said electron emitter; and
wherein said amplifier outputs a voltage corresponding to a collector current that flows in said collector electrode when said electrons are emitted from the electron emitter.

12. A memory device according to claim 11, wherein said write voltage comprises an analog voltage corresponding to analog data, and the electric charges accumulated in said memory represent an analog value corresponding to said analog data.

13. A memory device according to claim 12, wherein said read voltage for reading the analog value accumulated in said memory is of a constant value independent of said analog data.

14. An analog switch comprising:
an electron emitter including a memory for accumulating electric charges corresponding to an input voltage, for emitting electrons corresponding to the electric charges accumulated in said memory; and
an amplifier connected to a power supply and including a collector electrode for capturing the electrons emitted from said electron emitter;
wherein an atmosphere between at least said electron emitter and said collector electrode is a vacuum;

wherein said input voltage is applied to said electron emitter in an input period to accumulate electric charges corresponding to a level of said input voltage in said electron emitter;

wherein an on-control voltage necessary to emit electrons is applied to said electron emitter in an on-control period to emit electrons corresponding to the accumulated electric charges from said electron emitter; and wherein said amplifier outputs a voltage corresponding to a collector current that flows in said collector electrode when said electrons are emitted from the electron emitter.

15. A current control unit comprising:

an electron emitter including a memory for accumulating electric charges corresponding to an input voltage, for emitting electrons corresponding to the electric charges accumulated in said memory; and an amplifier connected to a power supply and including a collector electrode for capturing the electrons emitted from said electron emitter;

wherein a direction and an amount of an output current is controlled based on a direction and an amount of a collector current that flows into said collector electrode when said electrons are emitted from said electron emitter;

wherein said input voltage is applied to said electron emitter in an input period to accumulate electric charges corresponding to a level of said input voltage in said electron emitter;

wherein an on-control voltage necessary to emit electrons is applied to said electron emitter in an on-control period to emit electrons corresponding to the accumulated electric charges from said electron emitter; and wherein said amplifier outputs a voltage corresponding to a collector current that flows in said collector electrode when said electrons are emitted from the electron emitter.

* * * * *

UNITED STATES PATENT AND TRADEMARK OFFICE
CERTIFICATE OF CORRECTION

PATENT NO. : 7,719,201 B2  Page 1 of 1
APPLICATION NO. : 10/951832
DATED : May 18, 2010
INVENTOR(S) : Yukihisa Takeuchi, Tsutomu Nanataki and Iwao Ohwada It is certified that error appears in the above-identified patent and that said Letters Patent is hereby corrected as shown below:

On the Title Page, Related U.S. Application Data, Item (63):
 *please change* "Continuation-in-part of application No. 10/730,754, filed on Dec. 8, 2003, now Pat. No. 7,176,609, which is a continuation-in-part of application No. 10/678,958, filed on October 30, 2003, now abandoned." *to*
--Continuation-in-part of application No. 10/730,754, filed on Dec. 8, 2003, now Pat. No. 7,176,609, which is a continuation-in-part of application No. 10/678,958, filed on October 3, 2003, now abandoned.--

On the Title Page, References Cited, Item (56), Other Publications:
 *please change* "U.S. Appl. No. 10/979,747, filed Aug. 17 2004, Takeuchi et al." *to*
--U.S. Appl. No. 10/919,747, filed Aug. 17, 2004, Takeuchi et al.--

Signed and Sealed this

Seventh Day of September, 2010

David J. Kappos
*Director of the United States Patent and Trademark Office*